United States Patent
Dijaili et al.

(10) Patent No.: US 6,577,654 B1
(45) Date of Patent: Jun. 10, 2003

(54) OPTICAL SIGNAL POWER MONITOR AND REGULATOR

(75) Inventors: Sol P. Dijaili, Moraga, CA (US); Jeffrey D. Walker, El Cerrito, CA (US)

(73) Assignee: Genoa Corporation, Fremont, CA (US)

( * ) Notice: Subject to any disclaimer, the term of this patent is extended or adjusted under 35 U.S.C. 154(b) by 0 days.

(21) Appl. No.: 10/033,550

(22) Filed: Dec. 27, 2001

Related U.S. Application Data

(62) Division of application No. 09/299,824, filed on Apr. 26, 1999, now Pat. No. 6,347,104.
(60) Provisional application No. 60/118,769, filed on Feb. 4, 1999.

(51) Int. Cl.[7] ................................................. H01S 3/10
(52) U.S. Cl. ........................... 372/20; 359/344; 330/250
(58) Field of Search ..................... 372/29.014, 29.021, 372/38.06, 43; 359/344, 345, 349; 330/200, 278, 285

(56) References Cited

U.S. PATENT DOCUMENTS

| | | | | |
|---|---|---|---|---|
| 5,396,360 A | * | 3/1995 | Majima ......................... 359/133 |
| 5,469,454 A | * | 11/1995 | Delfyett, Jr. .................. 372/18 |
| 5,604,628 A | * | 2/1997 | Parker et al. ................ 359/344 |
| 5,644,423 A | * | 7/1997 | Iwano ......................... 359/337 |
| 5,739,935 A | * | 4/1998 | Sabella ........................ 359/128 |
| 5,754,571 A | * | 5/1998 | Endoh et al. .................. 372/20 |

* cited by examiner

Primary Examiner—Paul Ip
Assistant Examiner—Davienne Monbleau
(74) Attorney, Agent, or Firm—Fenwick & West LLP

(57) ABSTRACT

An optical signal power monitor and regulator comprises: a lasing semiconductor optical amplifier for receiving the optical signal and whose laser output is used to monitor a power level of the optical signal; a monitor circuit which receives the laser output and outputs a monitoring signal; a tunable element for receiving a version of the optical signal and whose level of amplification is adjustable and for outputting an amplified optical signal; and a regulator circuit for receiving the monitoring signal and adjusting the amplification of the tunable optical amplifier depending upon the monitoring signal. The tunable element may comprise a tunable gain-clamped semiconductor optical amplifier. Such an embodiment is capable of automatically regulating the tunable element such that a power level of the amplified optical signal is kept stable. In addition, the monitor circuit may be used to send status information regarding the optical signal to a network management system, which in turn may send to the regulator circuit a managing signal affecting the level of amplification to be applied to the optical signal.

42 Claims, 24 Drawing Sheets

OPTICAL SIGNAL POWER MONITOR AND REGULATOR

CROSS-REFERENCE TO RELATED PATENT APPLICATIONS

This application is a divisional of pending U.S. patent application Ser. No. 09/299,824, "Optical Signal Power Monitor and Regulator", by Sol P. Dijaili and Jeffrey D. Walker, filed Apr. 26, 1999 now U.S. Pat No. 6,347,104; which claims priority from provisional U.S. patent application Ser. No. 60/118,769, "Optical Signal Power Monitor and Regulator," by Sol P. Dijaili and Jeffrey D. Walker, filed Feb. 4, 1999. The disclosures of all of the foregoing are incorporated herein by reference.

BACKGROUND OF THE INVENTION

1. Field of the Invention

The present invention relates to optical communications systems. More particularly, the present invention relates to regulating and managing the operation of optical networks.

2. Description of the Background Art

A. Optical Communications Systems

Optical communications systems are rapidly becoming a widespread and important technology in telecommunications and networking. Optical communications systems transmit information optically at very high speeds over fiber optics.

The basic components of an optical communications system include: an optical transmitter; fiber optics; and an optical receiver. An optical transmitter incorporates information to be communicated into an optical signal and sends the optical signal. Fiber optics carries the optical signal over a distance. Finally, the optical receiver receives the optical signal and recovers the information therein.

B. Limited Dynamic Range of Optical Receivers

One problem with optical communications systems relates to the limited dynamic range of optical receivers. Optical receivers typically operate properly only within a relatively narrow range of optical signal power levels.

C. Attenuation of the Optical Signal

Another problem in optical communications systems is attenuation of the optical signal. The attenuation may occur due to transmission of the signal, distribution of the signal, and losses due to insertion of components in the transmission path. Optical amplifiers may be used to compensate for signal attenuation. However, conventional optical amplifiers have had various problems.

i Fiber Amplifiers

One type of conventional optical amplifier is a fiber amplifier. A fiber amplifier includes a length of fiber which is doped so that it may form an active gain medium. Ions of rare-earth metals, such as Erbium, are typically used as the dopant.

The doped fiber is pumped so that a population inversion of electronic carriers occurs in the active medium. The pump typically is an optical source whose wavelength is preferentially absorbed by the ions and yet different from the optical signal to be amplified. The optical signal is input from un-doped fiber to the doped fiber, experiences gain due to stimulated emission as it passes through the doped fiber, and then is output in amplified form from the doped fiber to further un-doped fiber.

One problem with fiber amplifiers is the narrow range of wavelengths that they can amplify when multiple fiber amplifiers are cascaded. Another problem with fiber amplifiers is their transient response to channel drop-out in wavelength division multiplexing systems. Further problems with fiber amplifiers include their relatively large size, slow speed for switching, power inefficiency, difficulties in mass producing them, and their high cost which makes them prohibitively expensive for many applications.

A problem of particular interest with fiber amplifiers is that the gain applied by fiber amplifiers may depend substantially on power levels.

ii. Conventional Semiconductor Optical Amplifiers

Another type of optical amplifier is a conventional semiconductor optical amplifier. Conventional semiconductor optical amplifiers comprise a semiconductor laser like structure which operates below the lasing threshold.

Typically, an electrical current is used to pump the electronic population in the active region of the amplifier. The optical signal is input from fiber optics to the active region of the amplifier, experiences gain due to stimulated emission as it passes through the active region, and is output in amplified form to further fiber optics.

One problem with conventional semiconductor optical amplifiers is that the amount of gain experienced by the input signal is dynamically dependent on the strength of the input signal at a particular instance in time. For instances when the input signal is higher, the signal experiences less gain than for instances when the input signal is lower. This dynamic gain variation is due to gain saturation. Gain saturation occurs when there are insufficient carriers in the conduction band to provide the full amount of gain to the higher signals.

D. Monitoring and Managing the Operation of Optical Networks

A further problem in optical communications systems relates to monitoring and managing the operation of optical networks. Enormous amounts of time and resources are used to build complex optical networks.

Monitoring the operation of such an optical network is needed to quickly and efficiently locate and solve problems (faults) in the optical network. For example, if a user of an optical network reports that his or her connection to a server suddenly dropped, then a network management engineer would want to be able to remotely check the operation at various locations between the user and the server in order to identify and locate the source of the fault.

Regulating the operation of such an optical network is needed to maximize its efficiency and robustness. For example, if optical signal power levels within one area of the network are too low in power, then a network management engineer would want to be able to remotely regulate devices in the network which control the optical signal power levels so as to correct the low power condition.

SUMMARY OF THE INVENTION

The problems and disadvantages heretofore associated with the prior art are overcome by the present invention. The present invention provides an optical signal power monitor and regulator. In accordance with a preferred embodiment of this invention the optical signal power monitor and regulator comprises: a lasing semiconductor optical amplifier for receiving the optical signal and whose laser output is used to monitor a power level of the optical signal; a monitor circuit which receives the laser output and outputs a monitoring signal; a tunable element for receiving a version of the optical signal and whose level of amplification is adjustable and for outputting an amplified optical signal; and a regulator circuit for receiving the monitoring signal and adjusting the amplification of the tunable optical amplifier depending upon the monitoring signal. Further in accordance with a preferred embodiment of the present invention, the tunable element comprises a tunable gain-clamped semiconductor optical amplifier. Such an embodiment is capable of automatically regulating the tunable element such that a power level of the amplified optical signal is kept stable. In addition, in accordance with a preferred embodiment of the present invention, the monitor circuit may be used to send status information regarding the optical signal to a network management system, which in turn may send to the regulator circuit a managing signal affecting the level of amplification to be applied to the optical signal.

BRIEF DESCRIPTION OF THE DRAWINGS

The teachings of the present invention can be readily understood by considering the following detailed description in conjunction with the accompanying drawings. The drawings are not necessarily done to scale.

FIG. 11A is a perspective drawing of the tunable-gain TLSOA 1100. FIG. 11B is a top view drawing of the tunable-gain TLSOA 1100 in FIG. 11A showing a tunable region 1112 between left cavity mirrors 1008 and additional mirrors 1114.

DETAILED DESCRIPTION OF THE EMBODIMENTS

Figure 1:
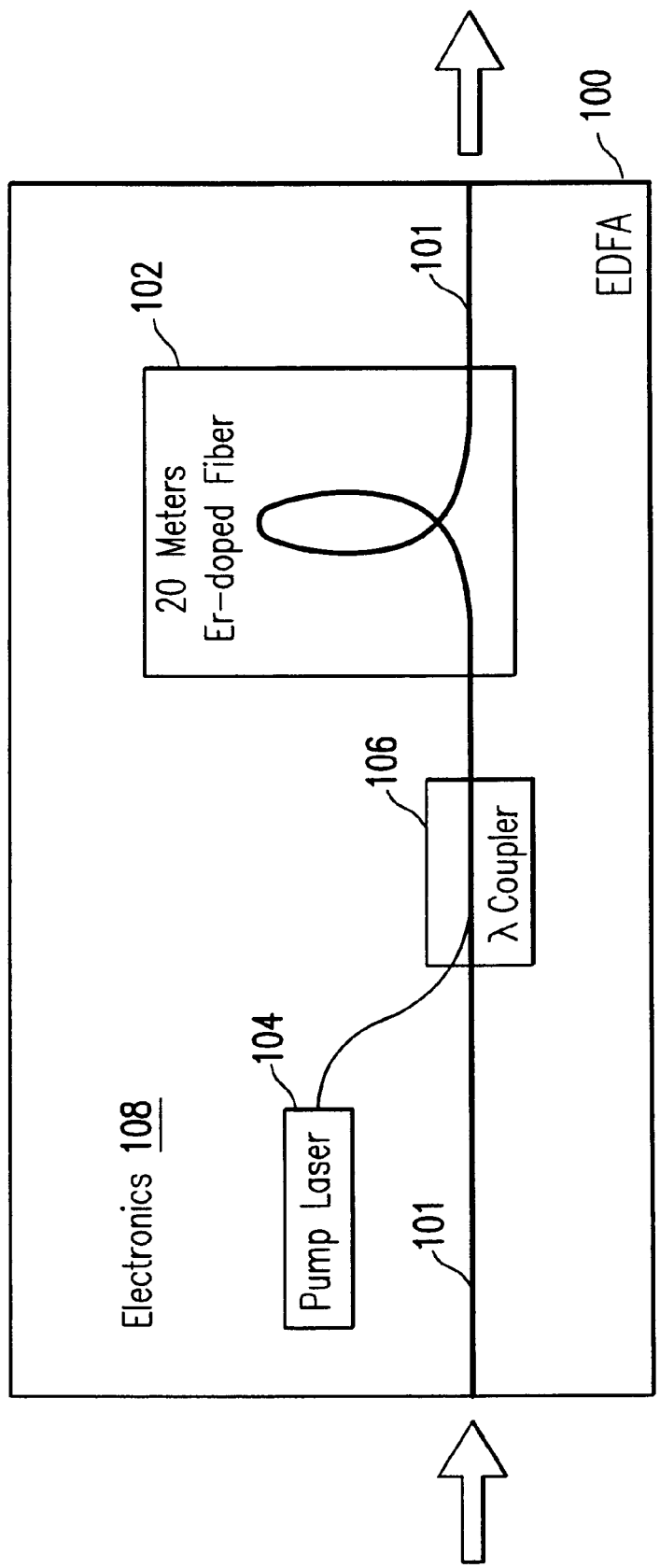
FIG. 1 is a schematic diagram of an erbium doped fiber amplifier (EDFA) 100.

FIG. 1 is a schematic diagram of an erbium doped fiber amplifier (EDFA) 100. The EDFA 100 typically includes about 20 meters of erbium-doped fiber 102 inserted into the fiber optics. A pump laser 104 provides light to excite the ions in the erbium-doped fiber 102, and a wavelength coupler 106 couples the light from the pump laser 104 to the fiber optics 101. As discussed above, the EDFA 100 has its problems and disadvantages.

Figure 2A:
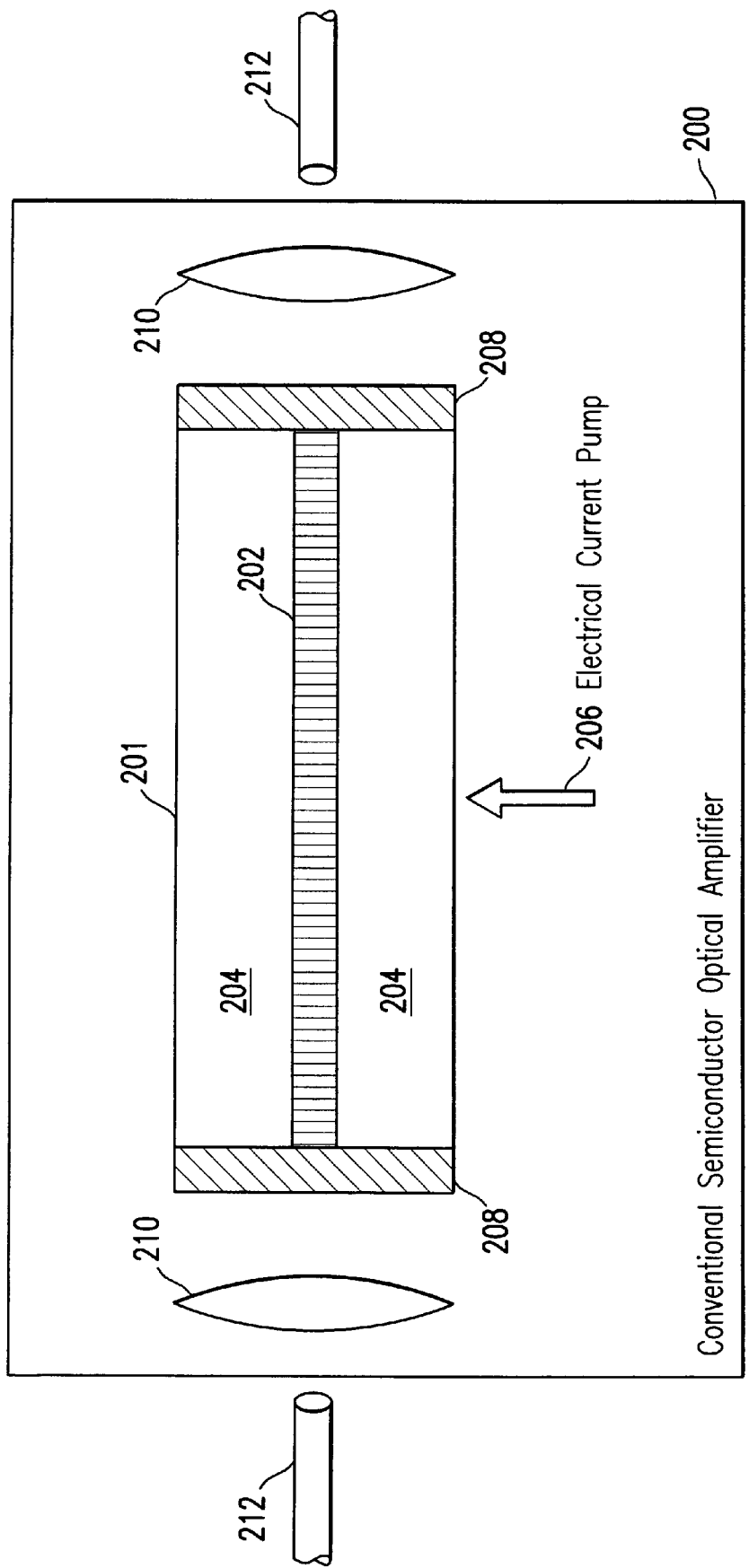
FIG. 2A is a schematic diagram of a conventional semiconductor optical amplifier (SOA) 200.

FIG. 2A is a schematic diagram of a conventional semiconductor optical amplifier (SOA) 200. The conventional SOA 200 comprises a semiconductor part 201 having an active region 202 with passive regions 204 surrounding the active region 202. The active region 202 comprises the semiconductor gain medium, and the passive regions 204 comprise wide bandgap semiconductor cladding regions. The edges of the semiconductor part 201 have antireflection coatings 208. The antireflection coatings 208 ensures that the semiconductor part 201 operates below a lasing threshold. Lenses 210 typically couple the semiconductor part 201 to the fiber optics 212.

Figure 2B:
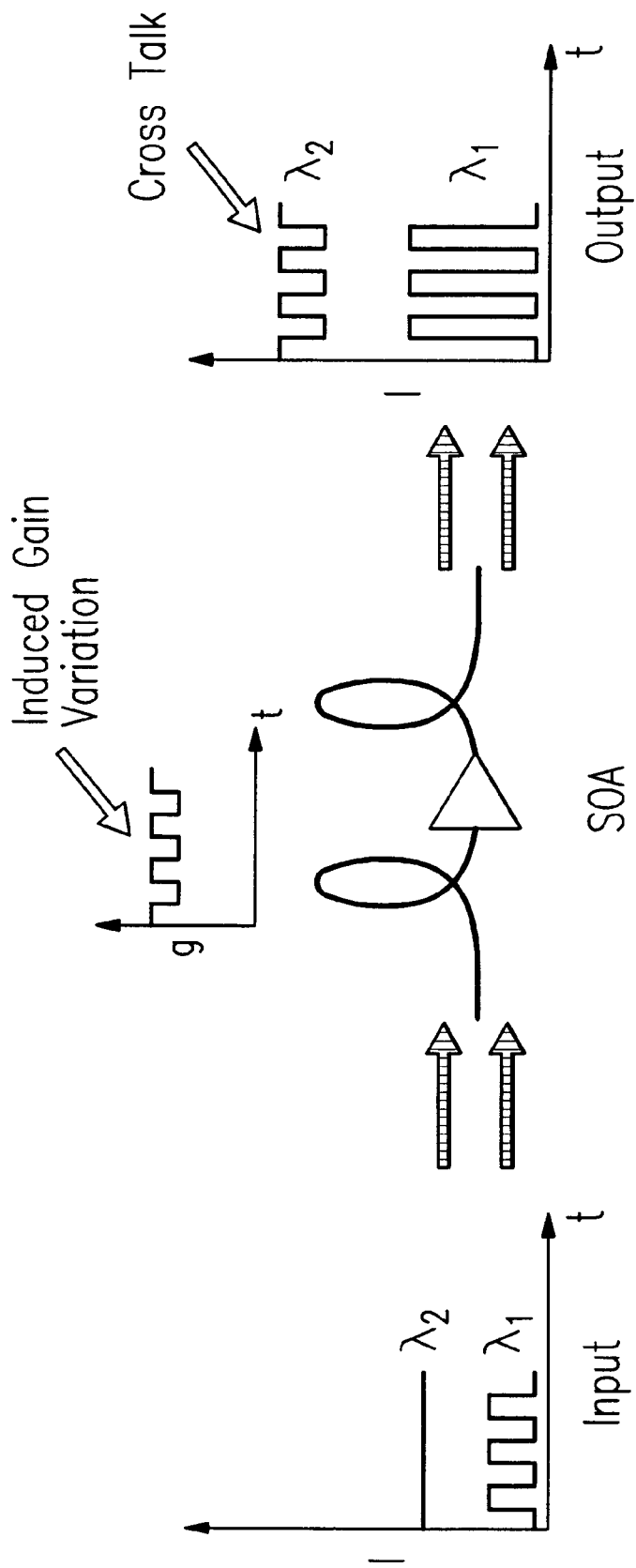
FIG. 2B is an illustration of the particular problems with the conventional SOA 200 relating to gain variation and crosstalk.

As discussed above, the conventional SOA 200 has its problems and disadvantages. Particular problems with the conventional SOA 200 relate to the gain variation and crosstalk induced by the input signal. These problems are illustrated in FIG. 2B where on the axes g=gain, I=intensity, and t=time. The crosstalk problem is especially important for wavelength division multiplexing (WDM) applications, but it is also important due to intersymbol interference in time-division multiplexing (TDM) applications and due to harmonic distortion in radio frequency (RF) applications. In addition, carrier lifetime in the conventional SOA 200 is limited to on the order of 1 nanosecond which limits the speed of the conventional SOA 200 to on the order of 1 GHz.

Figure 3A:
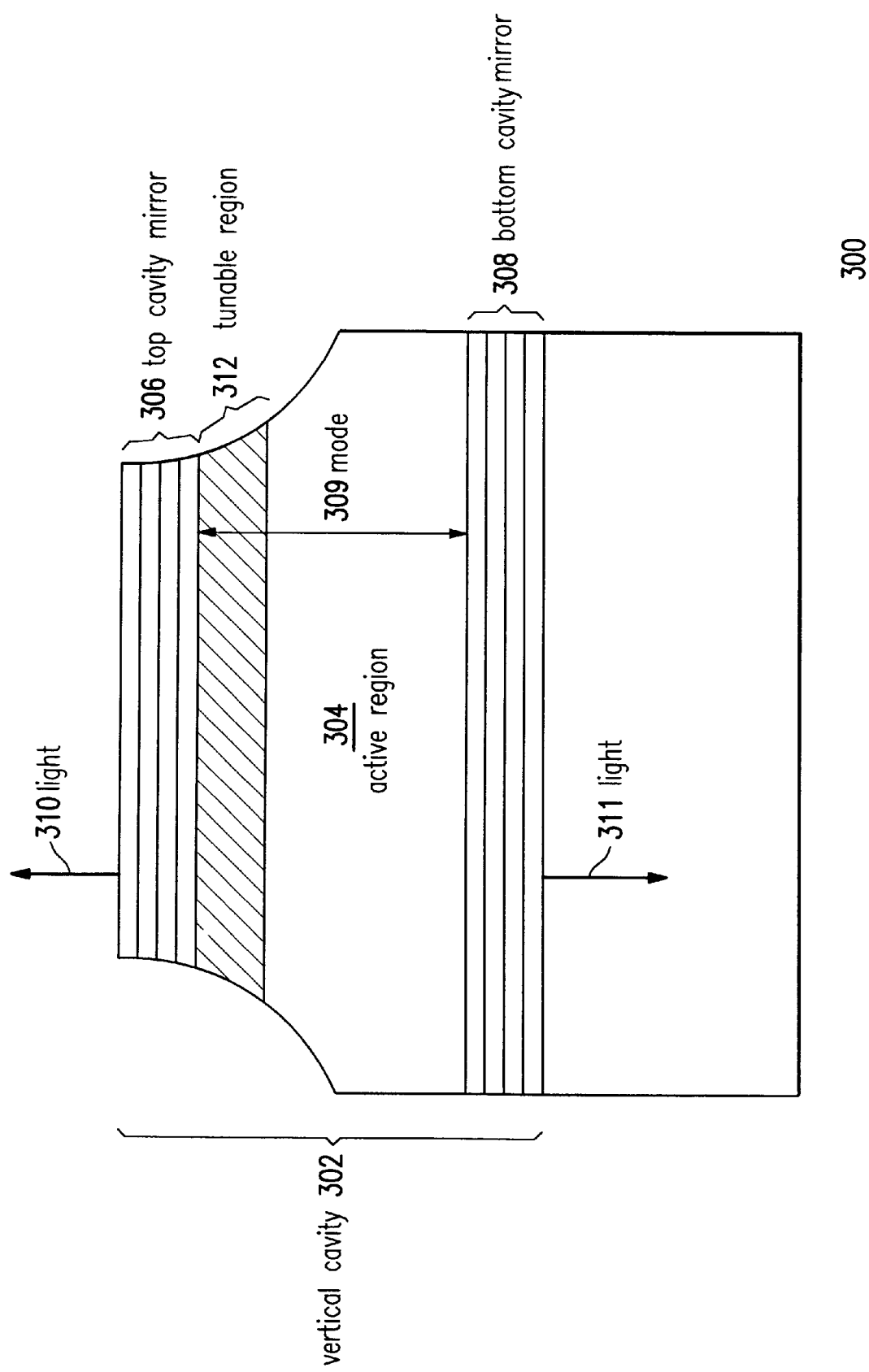
FIG. 3A is a cross-sectional diagram of a tunable-gain vertical-lasing semiconductor optical amplifier (VLSOA) 300 which includes a tunable region 312 between an active region 304 and a top cavity mirror 316 according to an embodiment of the present invention.

FIG. 3A is a cross-sectional diagram of a tunable-gain vertical-lasing semiconductor optical amplifier (VLSOA)

300 which includes a tunable region 312 between an active region 304 and a top cavity mirror 306 according to an embodiment of the present invention. The tunable-gain VLSOA 300 includes a vertical cavity 302 which comprises an active region 304, a top cavity mirror 306, a bottom cavity mirror 308 and a tunable loss layer 312.

The active region 304 comprises a semiconductor gain medium. The active region 304 may comprise a multiple quantum well (MQW) active region. Quantum wells enable the formation of lasers with relatively low threshold currents. Quantum wells may be fabricated using various materials systems, such as, for example, InAlGaAs and InP. MQW structures include several quantum wells. Alternatively, the active region 304 may comprise a double-heterostructure active region.

The cavity mirrors 306 and 308 may comprise Bragg reflectors or some other type of mirrors. Bragg reflectors are formed by periodic longitudinal variation of the index of refraction of a medium. These reflectors are efficient and highly wavelength selective in their reflectivity. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1/n_2)^{2N})\}^2$, where N is the number of periods (pairs) in the Bragg reflector. Reflectivities as high as 99% or more may be achieved. Bragg reflectors may be fabricated using various materials systems, such as, for example, alternating layers of GaAs and AlAs, or alternating layers of $SiO_2$ and $TiO_2$, or other multiple layer material systems.

The active region 304 is pumped. The pumping is performed at a sufficiently high level such that a lasing threshold of a mode 309 of the vertical cavity 302 is exceeded and light is output (310 and/or 311) at the frequency of the mode 309 from the top surface (310) and/or into the substrate (311). The frequency of the mode 309 may place the light (310 and/or 311) in the visible light range, infrared range, ultraviolet range, or any other frequency range. Alternatively, the light (310 and/or 311) may be generated but not actually emitted from the amplifier.

While operating above lasing threshold at the mode 309, an optical signal is input into the active region 304 in a direction generally perpendicular to the plane of FIG. 3A. As the optical signal travels through the active region 304, the optical signal is amplified by a constant gain multiplier due to stimulated emission of additional photons.

The gain multiplier is constant and independent of the dynamic strength of the optical signal because the laser light (310 and/or 311) acts as a ballast to prevent gain saturation. When the optical signal is weaker, less additional photons are stimulated by the optical signal, but more laser light is output (310 and/or 311). When the optical signal is stronger, more additional photons are stimulated by the optical signal, but less laser light is output (310 and/or 311).

Normally, the value of the constant gain multiplier is inversely proportional to the loss of the cavity mirrors 306 and 308. For example, if a 0.2% loss (99.8% reflectivity) gives a gain of 10 dB (10 times), then a three times larger 0.6% loss (99.4% reflectivity) would give a three times larger logarithmic gain of 30 dB (1000 times) for an otherwise identical device.

The value of the constant gain multiplier may be made tunable by the presence of a tunable loss layer 312. The tunable loss layer 312 is placed between the active region 304 and the top cavity mirror 306. Similar results would occur if the tunable loss layer 312 is placed between the active region 304 and the bottom cavity mirror 308. The tunable loss layer 312 may be, for example, a liquid crystal layer whose transmissivity may be tuned by the application of a voltage across the layer. The lower the transmissivity of the tunable loss layer 312, the lower the "effective" reflectivity of the top cavity mirror 306 and hence the higher the constant gain multiplier of the tunable-gain VLSOA 300.

Unfortunately, the tunable-gain VLSOA 300 in FIG. 3A is difficult to engineer. First, vertical cavity surface emitting lasers (VCSELs) such as the one in FIG. 3A require high reflectivity mirrors, typically with reflectivities about 99.5% each. The tunable region 312 typically has some loss associated with it due to absorption, diffraction, and scattering. Because of this, it is difficult to engineer the combination of the tunable region 312 and the top mirror 306 such that the composite reflectivity is in the 99.5% range. This is made particularly difficult if electrical pumping is used for the VCSEL in FIG. 3A because the electrical contact typically required between tunable region 312 and top mirror 306 will lead to additional optical loss. Fortunately, the need for such high composite reflectivity may be overcome with the tunable-gain VLSOA designs in FIGS. 4 through 8.

Second, the tunable-gain VLSOA 300 in FIG. 3A is difficult to engineer because the design in FIG. 3A requires extremely fine control of the tunable loss layer 312 in order to tune the constant gain multiplier of a high gain device. The tunable gain VLSOA 300 typically requires adjusting one of the mirror reflectivities over the range of 95% to 100%. A typical variation would be about 99.2% to 99.8%. In this case, assuming a fixed loss of 0.2%, the loss introduced by the tunable region 312 needs to vary from about 0% to 0.6% for full tuning of the device. This put strict requirements on the range of tunable loss introduced by the tunable region 312, and makes the device.very sensitive to even small 0.1% changes in this loss. Fortunately, the need for such fine control may be avoided with the tunable-gain VLSOA designs in FIGS. 4 through 8.

Third, the tunable-gain VLSOA 300 in FIG. 3A may be difficult to engineer because the tunable region 312 would be limited to using tunable absorption, rather than tunable phase or refractive index, since tunable phase would have a negligible effect in this design.

Fourth, the tunable-gain VLSOA 300 in FIG. 3A may be difficult to engineer because VCSELs have very high optical power intensities between the mirrors 306 and 308, and placing the tunable region 312 inside this cavity will likely lead to saturable absorption problems. For example, the laser power will be high enough to "bleach" carriers in the case where the tunable region is a tunable absorber based on band filling effects in quantum wells. One possible solution to this problem is to place the absorbing wells close to a standing wave minima of the optical field, but this significantly decreases desired tuning effect.

Fifth, the tunable-gain VLSOA 300 in FIG. 3A may be difficult to engineer because in preferred implementations of the VLSOA 300, if the tunable region 312 uses optical absorption, this absorption layer should be placed in such a way that it interacts with the optical mode of the VCSEL only, and does not interact with the optical mode of the amplified signal. Implementation of this requirement is more difficult in this design than in the tunable-gain VLSOA designs in FIGS. 4 through 8.

Figure 3B:
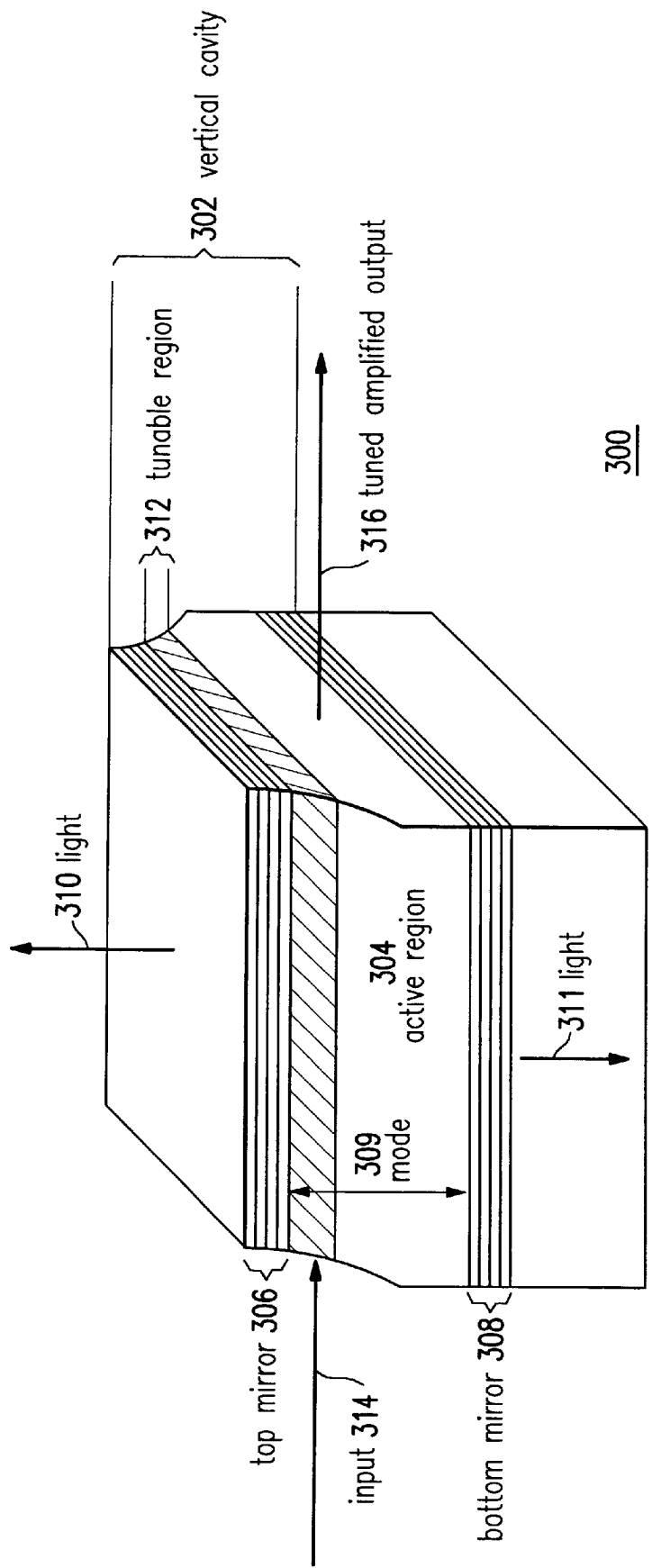
FIG. 3B is a perspective drawing of the tunable-gain VLSOA 300 of FIG. 3A.

FIG. 3B is a perspective drawing of the VLSOA 300 of FIG. 3A. The perspective drawing shows the optical signal input 314 into the VLSOA 300 and the amplified optical signal output 316 from the VLSOA 300.

Figure 3C:
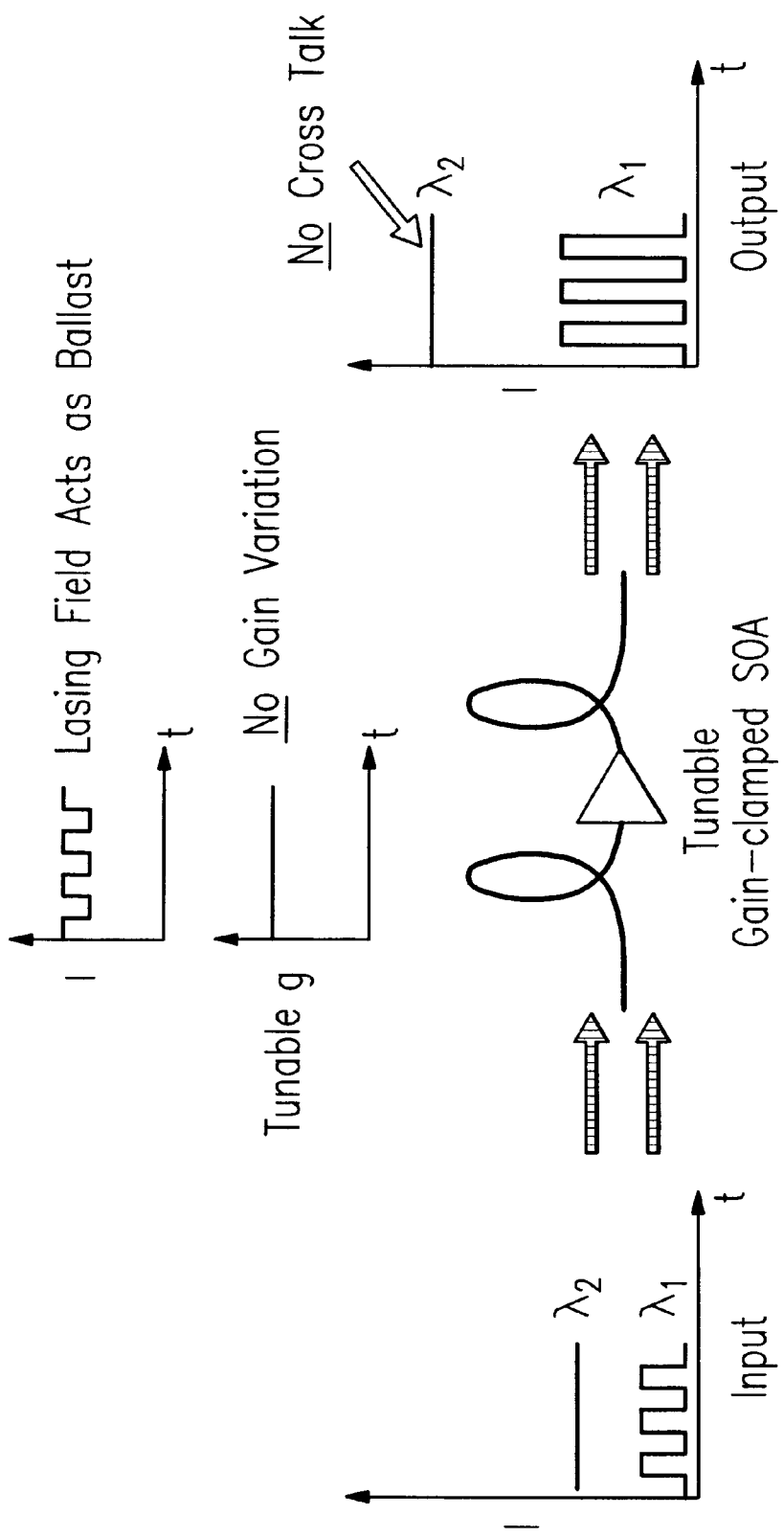
FIG. 3C is an illustration of the solutions provided by the tunable-gain VLSOA 300 to the gain variation and crosstalk problems of the conventional SOA 200.

FIG. 3C is an illustration of the solution provided by the tunable-gain VLSOA 300 to the gain variation and crosstalk problems of the conventional SOA 200. As in FIG. 2B, g=gain, I=intensity, and t=time. The solution uses the laser output as a sort of a ballast to maintain a constant gain multiplier. The result is no gain variation and no crosstalk. In addition, carrier lifetime in the tunable-gain VLSOA 300 may be on the order of 10 picoseconds which allows increased speeds on the order of 100 GHz for the VLSOA 300.

Figure 3E:
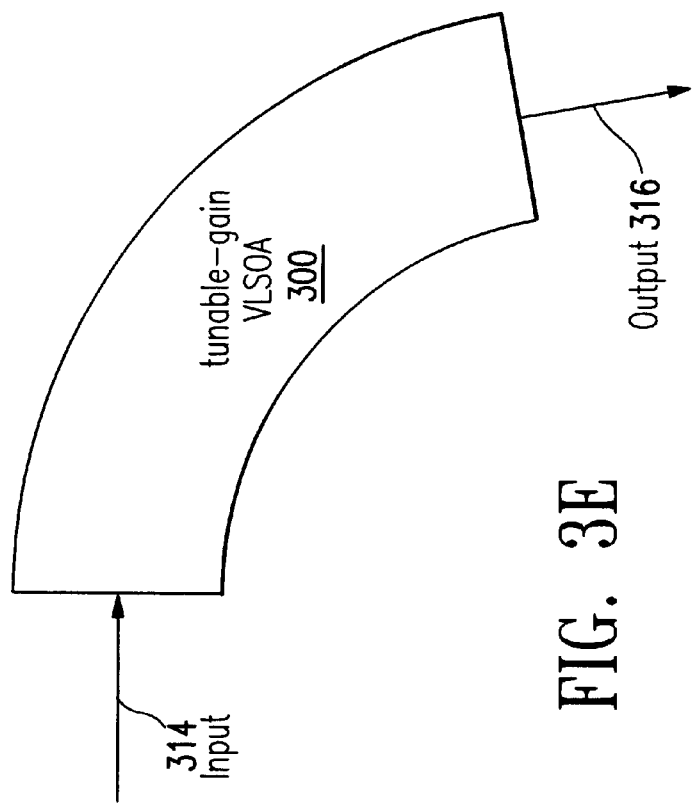
FIGS. 3D and 3E illustrate two possible alternate configurations for the tunable-gain VLSOA 300.
Figure 3D:
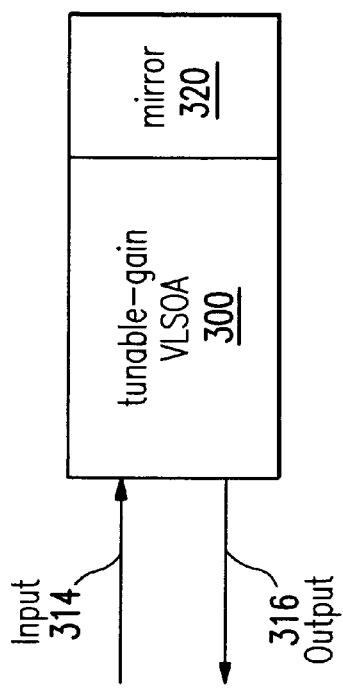

FIGS. 3D and 3E illustrate two possible alternate configurations for the tunable-gain VLSOA 300. In particular, FIG. 3D shows a block diagram of a configuration where the input 314 enters and the output 316 exits the tunable-gain VLSOA 300 via a same surface. FIG. 3E shows a block diagram of a configuration where the tunable-gain VLSOA 300 is physically curved.

Figure 4A:
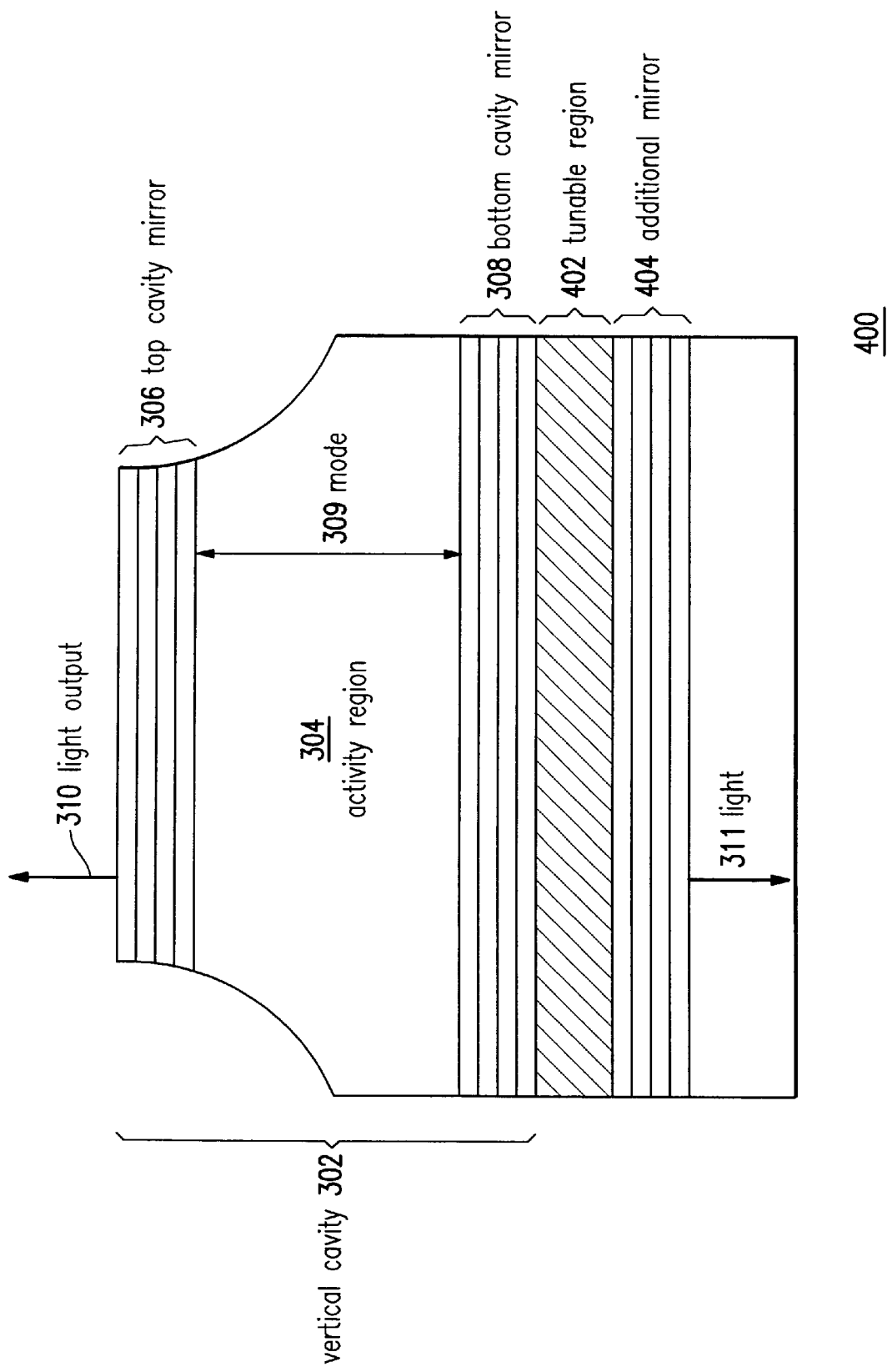
FIG. 4A is a cross-sectional diagram of a tunable-gain VLSOA 400 which includes a tunable region 402 between a bottom cavity mirror 308 and an additional mirror 404 according to a preferred embodiment of the present invention.

FIG. 4A is a cross-sectional diagram of a tunable-gain VLSOA 400 which includes a tunable region 402 between the bottom cavity mirror 308 and an additional mirror 404 according to a preferred embodiment of the present invention. The tunable region 402 may be a liquid crystal layer or another adjustable loss layer. The additional mirror 404 may be a Bragg reflector or another type of mirror.

In comparison to the tunable-gain VLSOA in FIG. 3A, the tunable-gain VLSOA in FIG. 4A moves the tunable region 402 outside of the vertical cavity 302, sandwiching the tunable region 402 between the bottom cavity mirror 308 and an additional mirror 404. By so moving the tunable region 402, the need for extremely fine control of the tunable loss layer 312 is avoided. The tunable region 402 and the additional mirror 404 may be integrated into the semiconductor device itself or, alternatively, may be external to the semiconductor device. For example, the additional mirror 404 may be fabricated epitaxially to be part of the semiconductor device, or it may be on positioned on the back surface of the semiconductor wafer.

The effective reflection of the bottom cavity mirror 308 would depend on the reflectivities of the bottom cavity mirror and the additional mirror 404, the absorption of the tunable region 402, the thickness of the tunable region 402, and the index of refraction of the tunable region 402. The thickness and index of refraction of the tunable region 402 affects the phase condition between the reflection from the bottom cavity mirror 308 and the reflection from the additional mirror 404.

The tunable-gain VLSOA 400 in FIG. 4A overcomes the five above-discussed reasons why the tunable-gain VLSOA 300 in FIG. 3 may be difficult to engineer. First, the need for high composite reflectivity is overcome because the bottom mirror 308 may be designed to provide almost all of the reflectivity needed to achieve lasing threshold in the VCSEL and higher losses, may be tolerated in the tunable region 402.

Second, the need for extremely fine control of the tunable region 312 is overcome because reflectivities of the bottom mirror 308 and the additional mirror 404 may be designed such that this corresponds to full tuning of the tunable-gain VLSOA 400 from say 20 dB gain to 30 dB gain. This makes possible designs where the tuning mechanism is, for example, a LCD on top of the VLSOA chip where the loss may vary, for example, from 80% to 100% depending on applied voltage.

Third, the limitation to using tunable absorption in the tunable region 312, rather than tunable phase or refractive index, is overcome by the tunable-gain VLSOA 400 design in FIG. 4A. This is because the VLSOA 400 design in FIG. 4A is a three-mirror design and thus has two optical cavities. The design is thus sensitive to both tunable absorption and tunable phase (change in index of refraction or length).

Fourth, saturable absorption problems due to placing the tunable region 312 inside the VCSEL cavity is overcome by the tunable-gain VLSOA 400 design in FIG. 4A. This is.because the VLSOA 400 design in FIG. 4A moves the tunable region 402 away from the center of the VCSEL optical cavity to a position where the optical field intensity is greatly reduced, and thus eliminates the saturable absorption problems for most implementations.

Fifth, problems with the tunable region 312 interacting with the optical mode of the amplified signal is overcome by the VLSOA 400 design in FIG. 4A. This is because the VLSOA 400 design in FIG. 4A moves the tunable region 402 away from the optical mode of the amplified signal which lies primarily in the active region 304.

The index of refraction of the tunable region 402 (and hence the phase difference between the reflections from the bottom cavity mirror 308 and the additional mirror 404) may be adjusted using physical mechanisms which occur within semiconductor material such as, for example, the thermo-optic effect, the quantum-confined Stark effect, the Franz-Keldysh effect, the Burstein-Moss effect (band filling), the electro-optic effect, and the acousto-optic effect. These effects by themselves are described in various publicly available literature. A tunable region 402 using such physical mechanisms may (optionally) be built directly into a lasing SOA device to make the lasing SOA device tunable. Alternatively, the index of refraction of the tunable region 402 may be adjusted using physical mechanisms which occur external to a semiconductor device such as, for example, a liquid crystal mechanism, an air bridge mechanism which moves or tilts the additional mirror 404, a mechanism to change the curvature of the additional mirror, and a razor-edge or neutral density filter mechanism between the bottom cavity mirror 308 and the additional mirror 404.

An example of a preferred embodiment of a bottom structure (308+402+404) for the tunable-gain VLSOA 400 in FIG. 4A is described as follows. In a preferred embodiment, the bottom mirror 308 is a 20 pair Bragg reflector made of quarter wavelength thick layers in alternation of AlAs (112 nanometers thick for a 1.3 micron wavelength device) and GaAs (96 nanometers thick for a 1.3 micron wavelength device). This bottom mirror 308 by itself has 99.2% reflectivity and 0.8% transmissivity (for the case where the light is incident from and transmits into GaAs material). By reflecting 10% of the transmitted light back at the bottom mirror 308 by the tunable region 402 and the additional mirror 404, the effective reflectivity of the bottom structure (308+402+404) should increase from 99.2% to 99.6% according to simulations of the reflectivity. Similarly, by reflecting 20% of the transmitted light, the effective reflectivity of the bottom structure should increase to 99.7%. And, by reflecting 30% of the transmitted light, the effective reflectivity of the bottom structure should increase to 99.8%.

Figure 4B:
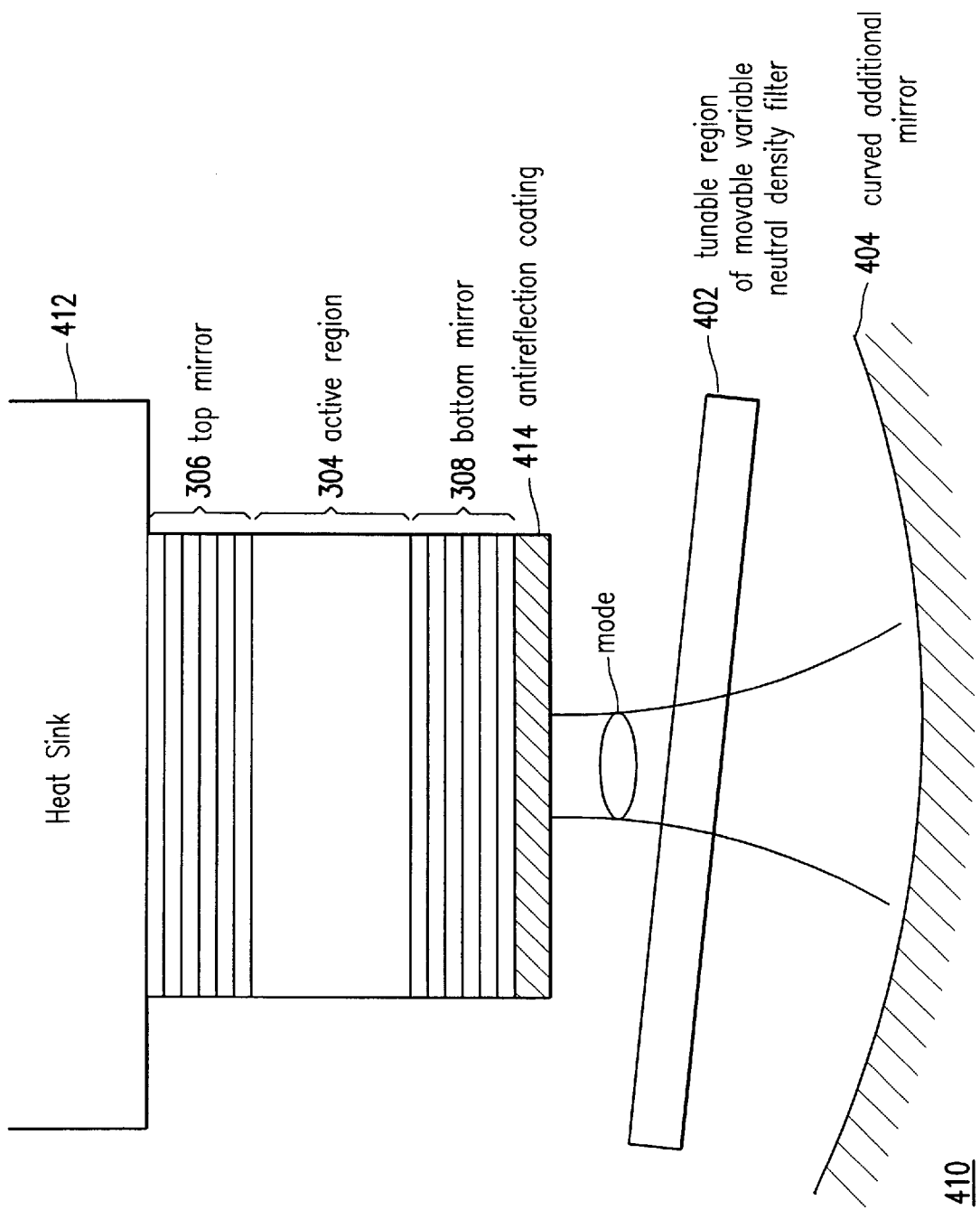
FIG. 4B is a cross-sectional diagram showing a currently preferred implementation 410 for the tunable-gain VLSOA 400 in FIG. 4A.

A currently preferred implementation 410 for the tunable-gain VLSOA 400 in FIG. 4A is shown in further detail in FIG. 4B. First, the additional mirror 404 is a curved mirror to reduce diffraction loss and to make alignment easier. The confocal design for the additional mirror 404 shown in FIG. 4B does not need to be perfectly parallel with the VCSEL device.

Second, the additional mirror 404 is placed relatively far away (on the order of 1 cm away in a preferred embodiment)

from the VCSEL to reduce the mode spacing of this external cavity (to about 0.1 nm in a preferred embodiment). The reduction in the mode spacing of the external cavity removes a phase requirement for the reflection. A potential disadvantage with this placement of the additional mirror 404 is that the relatively long cavity round trip time and mode-locking effects could limit the speed of the device. Other designs described in this application may be higher in speed.

Third, the tunable region 402 comprises a variable attenuator made from a neutral density filter wheel or slide. The neutral density wheel or slide may be used to adjust the percent of light reflected back into the cavity. As shown in FIG. 4B, this filter may be placed at an angle such that any light reflecting from its surface does not reflect back into the laser cavity.

Fourth, an antireflection coating 414 may be applied to the surface of the bottom mirror 308. Such an antireflection coating 414 may be used to eliminate the reflection (about 30%) from a GaAs-to-air interface between the bottom mirror 308 and the air of the external cavity. The 99.2% Bragg reflectivity for the bottom mirror 308 discussed above with respect to FIG. 4A does not account for the reflection from such a GaAs-to-air interface. Alternatively, a 16 pair Bragg reflector with the GaAs-to-air interface reflection has about the same 99.2% reflectivity and could be used instead of the 20 pair Bragg plus antireflection coating.

Fifth, a heat sink 412 is shown FIG. 4B as attached to the top mirror 306. Such a heat sink 412 is utilized to cool the device.

Figure 5:
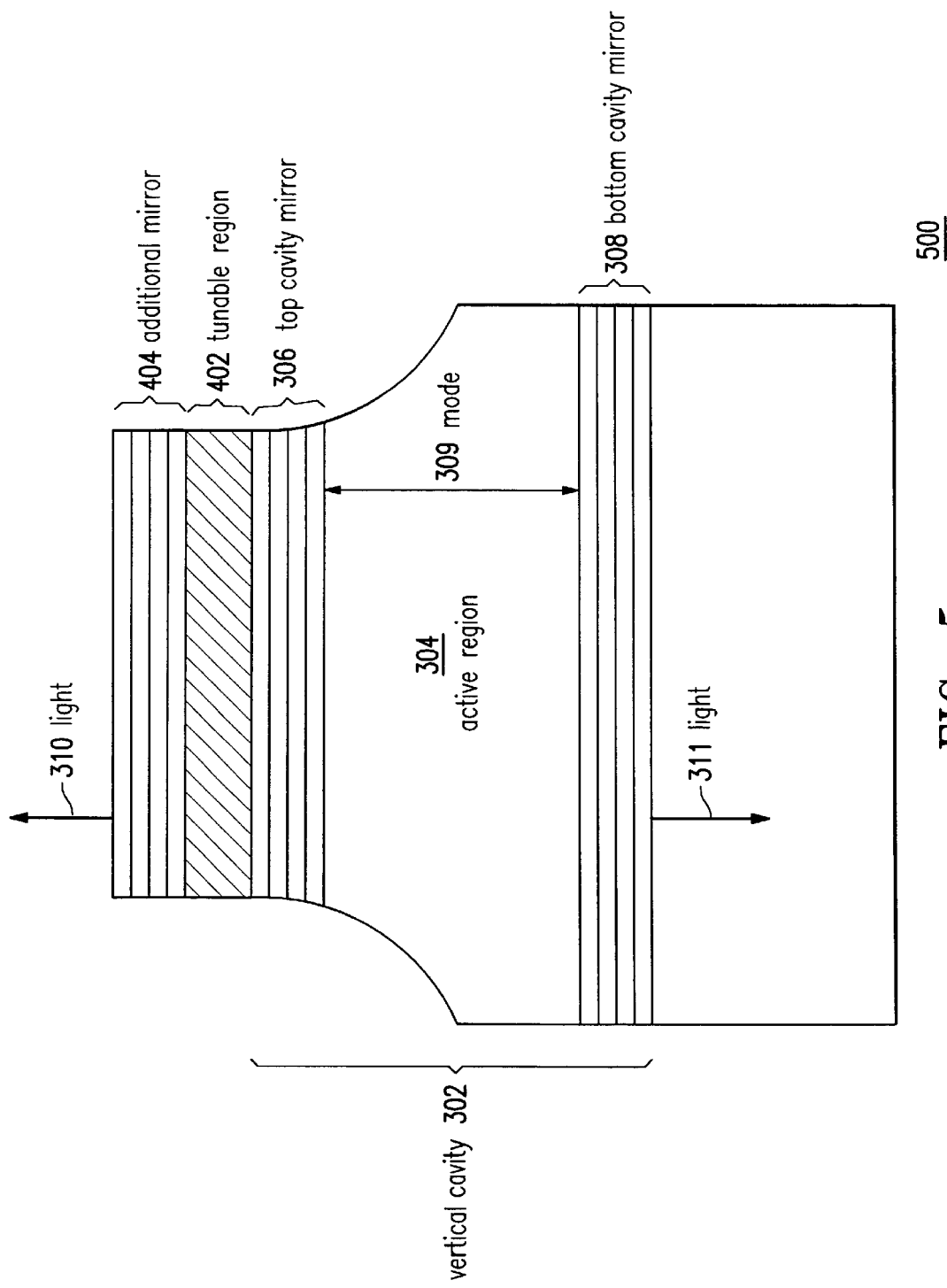
FIG. 5 is a cross-sectional diagram of a tunable-gain VLSOA 500 which includes a tunable region 402 between the top cavity mirror 306 and the additional mirror 404 according to a preferred embodiment of the present invention.

FIG. 5 is a cross-sectional diagram of a tunable-gain VLSOA 500 which includes a tunable region 402 between the top cavity mirror 306 and the additional mirror 404 according to a preferred embodiment of the present invention. Again, the tunable region 402 may be a liquid crystal layer or another adjustable loss layer, and the additional mirror 404 may be a Bragg reflector or another type of mirror.

The tunable-gain VLSOA 500 in FIG. 5 is similar to the tunable-gain VLSOA in FIG. 4, except that the tunable-region 402 and the additional mirror 404 are moved from below the bottom cavity mirror 308 to above the top cavity mirror 306. For the tunable-gain VLSOA 500 in FIG. 5, using only relatively rough control of the tunable region 402, fine control is achieved over the effective reflectivity of the top cavity mirror 306 and hence over the constant gain multiplier of the tunable-gain VLSOA 500.

Figure 6:
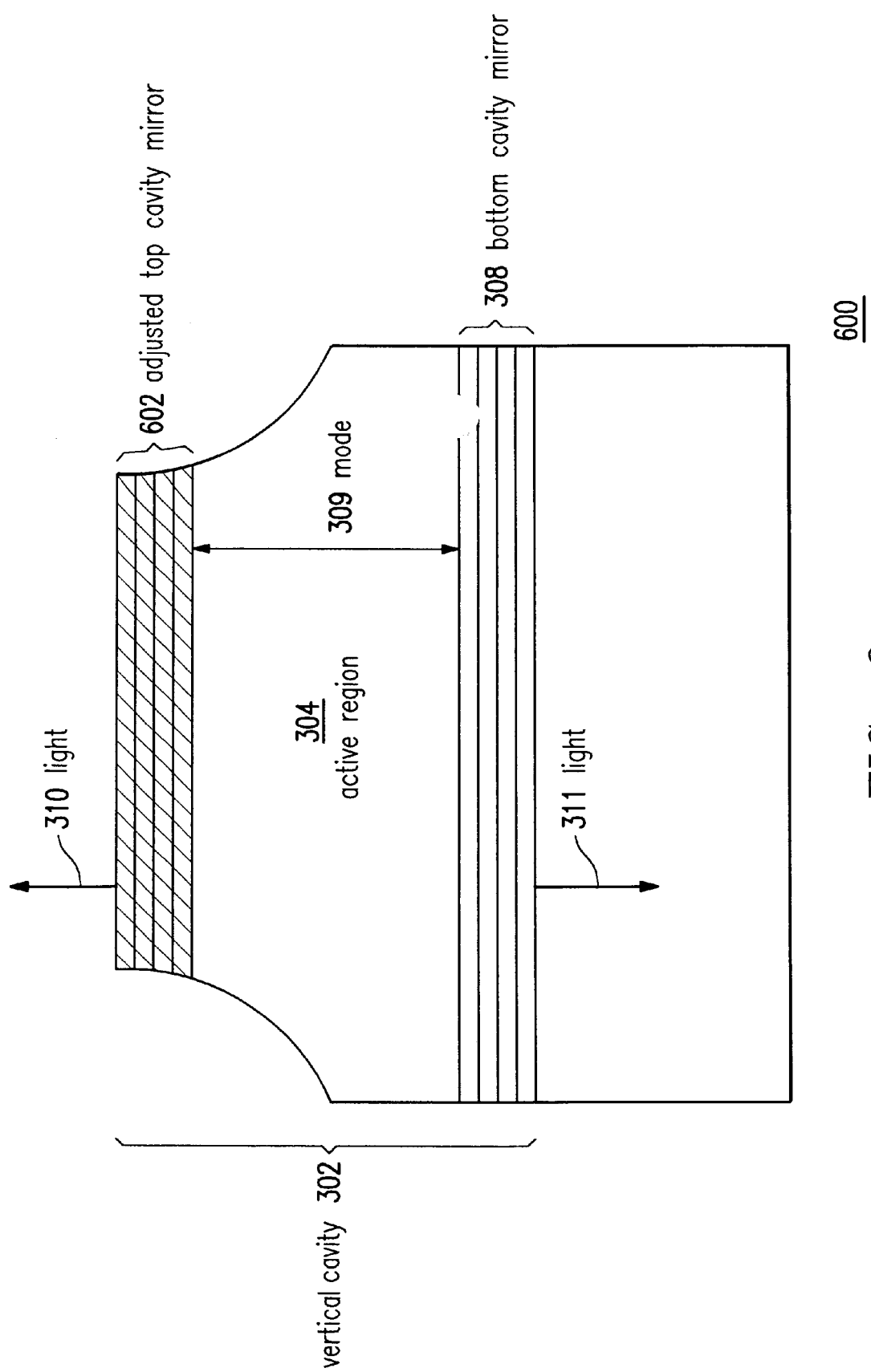
FIG. 6 is a cross-sectional diagram of a tunable-gain VLSOA 600 including an adjusted top cavity mirror 602 according to an embodiment of the present invention.

FIG. 6 is a cross-sectional diagram of a tunable-gain VLSOA 600 including an adjusted top cavity mirror 602 according to an embodiment of the present invention. The adjusted top cavity mirror 602 may be, for example, a Bragg reflector whose effective reflectivity has been lowered by ion implantation, by temperature Adjustment, by an applied voltage, by decreasing (or increasing) the number of layers of the Bragg reflector, by mechanical deformation of the mirror 602, by tilting the mirror 602, by horizontally displacing the mirror 602, or by some other mechanism. Some mechanisms, such as ion implantation and changing the number of layers in the Bragg reflector may be used to adjust the amplification during manufacture of the tunable-gain VLSOA 600. Other mechanisms, such as the temperature adjustment and the applied voltage, may be used to adjust the amplification in the field after manufacture of the tunable-gain VLSOA 600.

For example, ion implantation may be used on a Bragg reflector to form the adjusted top cavity mirror 602. The Bragg reflector may be originally formed such that it had a reflectivity, for example, of about 99.8%. Subsequently, implantation of hydrogen (H) ions, oxygen (O), or iron (Fe) or other species of ions at controlled energies may be used create damage-related or chemical-related optical absorption in the Bragg reflector in order to lower its effective reflectivity to say 99.5%. The change in reflectivity imposed by the ion implantation would depend on the species of ions used and the implant energy, dose and subsequent annealing conditions.

Figure 7:
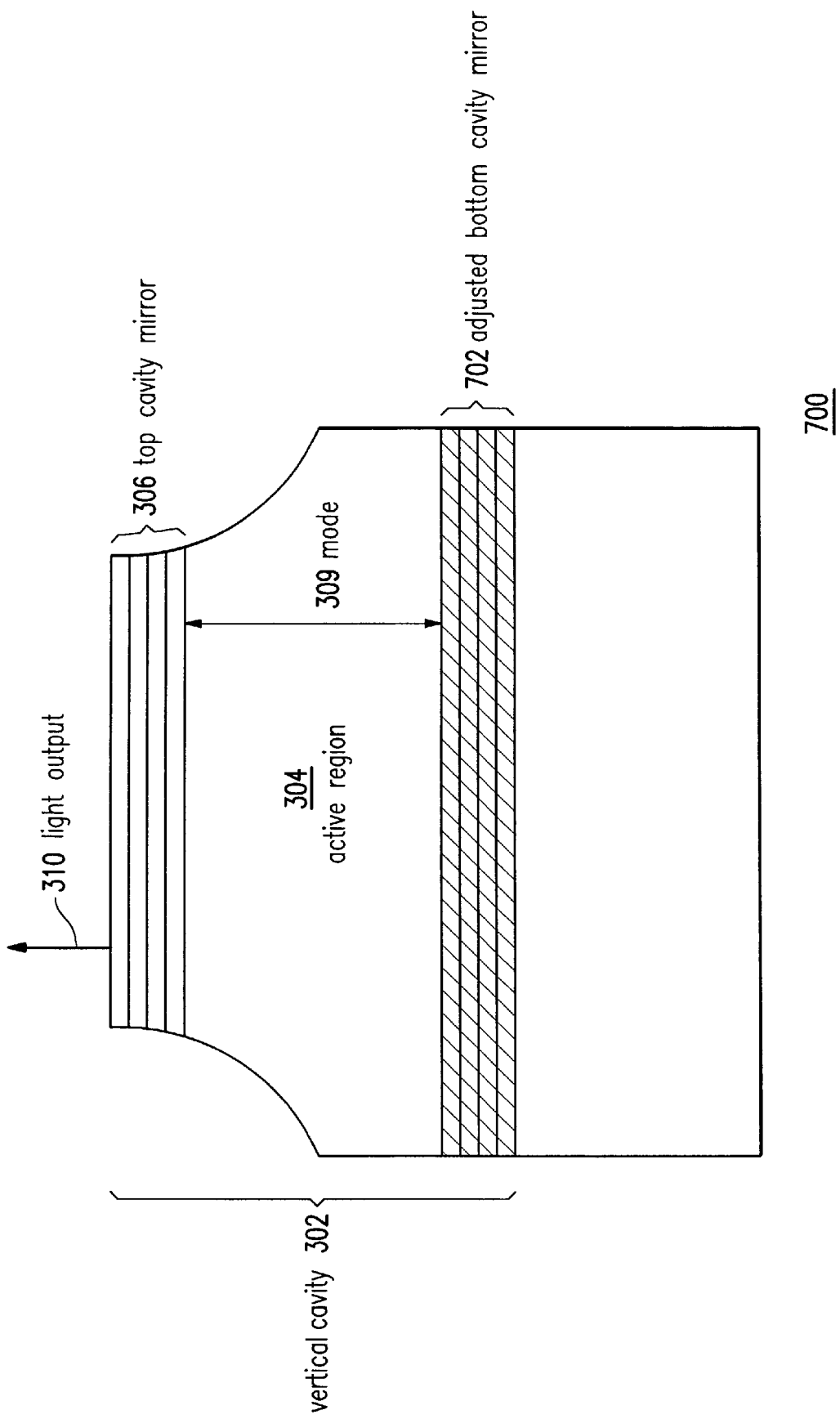
FIG. 7 is a cross-sectional diagram of a tunable-gain VLSOA 700 including an adjusted bottom cavity mirror 702 according to an embodiment of the present invention.

FIG. 7 is a cross-sectional diagram of a tunable-gain VLSOA 700 including an adjusted bottom cavity mirror 702 according to an embodiment of the present invention. Like the adjusted top cavity mirror 602 in FIG. 6, the adjusted bottom cavity mirror 702 in FIG. 7 may be, for example, a Bragg reflector whose effective reflectivity has been lowered by ion implantation, by temperature adjustment, by an applied voltage, by decreasing (or increasing) the number of layers of the Bragg reflector, by mechanical deformation of the mirror 602, by tilting the mirror 602, by horizontally displacing the mirror 602, or by some other mechanism.

Figure 8A:
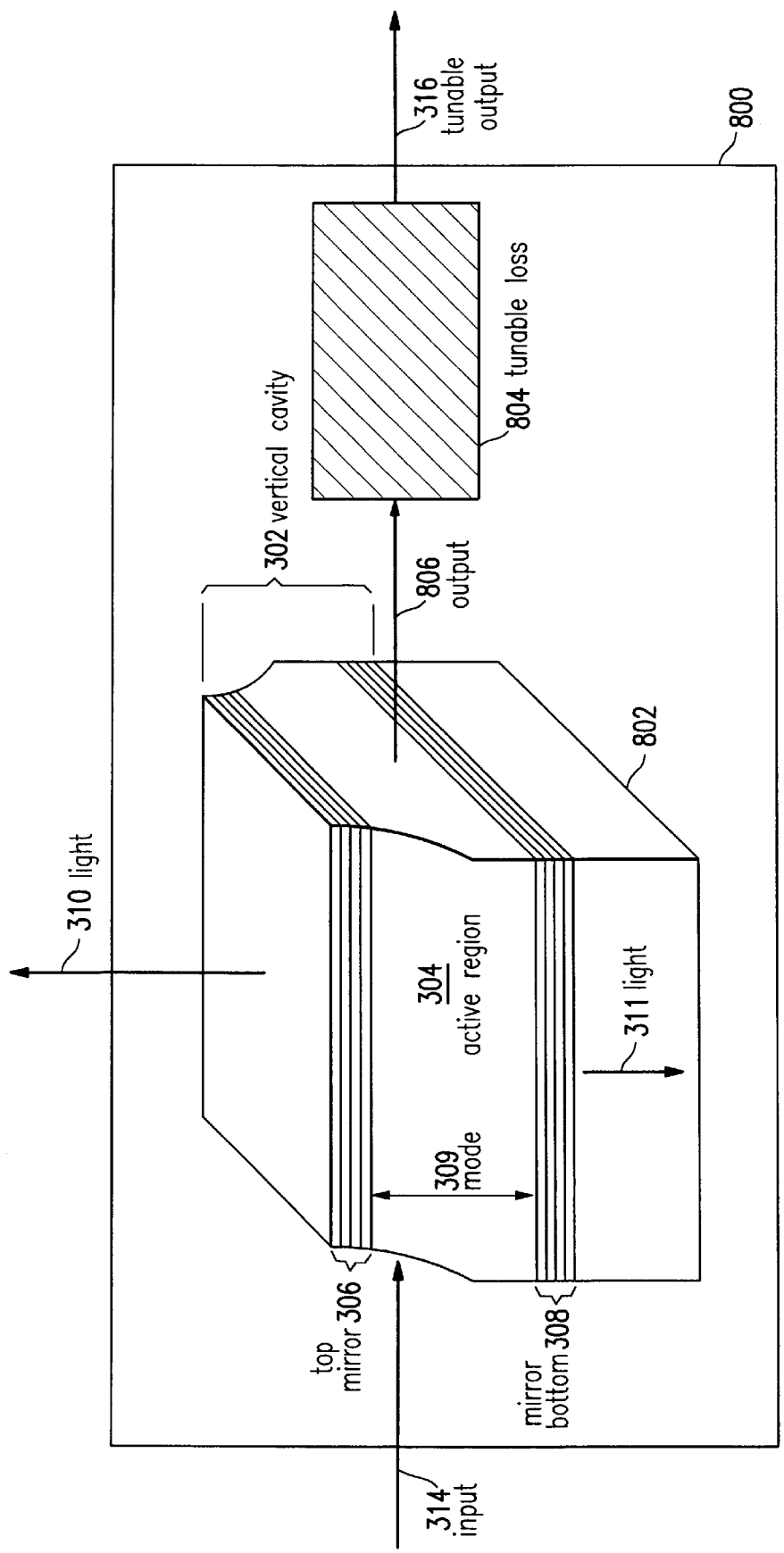
FIG. 8A is a diagram of a unidirectional apparatus 800 including a lasing SOA 802 drawn in perspective and a tunable loss element 804 drawn in block form according to a preferred embodiment of the present invention.

FIG. 8A is a diagram of a tunable-gain lasing semiconductor optical amplifier apparatus 800 including a lasing semiconductor optical amplifier 802 drawn in perspective and a tunable loss element 804 depicted in block form according to a preferred embodiment of the present invention. The particular lasing SOA 802 shown in FIG. 8A is a vertical-lasing semiconductor optical amplifier (VLSOA). In a preferred embodiment of the present invention, the lasing SOA 802 and the tunable loss element 804 may be packaged together as one apparatus 800.

The lasing SOA 802 includes a vertical cavity 302 which comprises an active region 304, a top cavity mirror 306, and a bottom cavity mirror 308. The active region 304 is pumped. The pumping is performed at a sufficiently high level such that a lasing threshold of a mode 309 of the vertical cavity 302 is exceeded and laser light is output (310 and/or 311) at the frequency of the mode 309 from the top surface (310) and/or into the substrate (311).

While operating above lasing threshold at the mode 309, an optical signal 314 is input into the active region 304. As the optical signal 314 travels through the active region 304, the optical signal 314 is amplified by a constant gain multiplier due to stimulated emission of additional photons. The amplified optical signal 806 is output from the other end of the active region 304.

The gain multiplier is constant and independent of the dynamic strength of the optical signal 314 because the laser light (310 and/or 311) acts as a ballast to prevent gain saturation. When the optical signal 314 is weaker, less additional photons are stimulated by the optical signal 314, but more laser light is output (310 and/or 311). When the optical signal 314 is stronger, more additional photons are stimulated by the optical signal 314, but less laser light is output (310 and/or 311).

The amplified optical signal 806 is output from the lasing SOA 802 into the tunable loss element 804. The tunable loss element 804 reduces the strength of the amplified optical signal 806 by a tunable amount and so generates a tunable amplified output 316. The tunable loss element 804 may comprise various types of loss elements. The tunable loss element 804 may comprise, for example, a liquid crystal element whose transmissivity is adjusted by varying the voltage across the liquid crystal. As another example, the tunable loss element 804 may comprise an element which uses the positioning of a razor edge within the element to adjust the loss induced by the element. As yet another example, the tunable loss element 804 may comprise an optical attenuator which uses a coupling loss between two fibers to adjust attenuation. As a final example, the tunable loss element 804 may use graded index (GRIN) lenses to expand the entering optical signal 806, refocus the exiting optical signal 316, and place a tunable filter in the expanded beam within the tunable loss element 804.

An alternative embodiment of the apparatus in FIG. 8A would position the tunable loss element 804 before the lasing SOA 802 such that the tunable loss element 804 receives the input optical signal 314. However, such an embodiment would be disadvantageous as the effect of noise in the input optical signal 314 would be increased in such an embodiment.

Figure 8B:
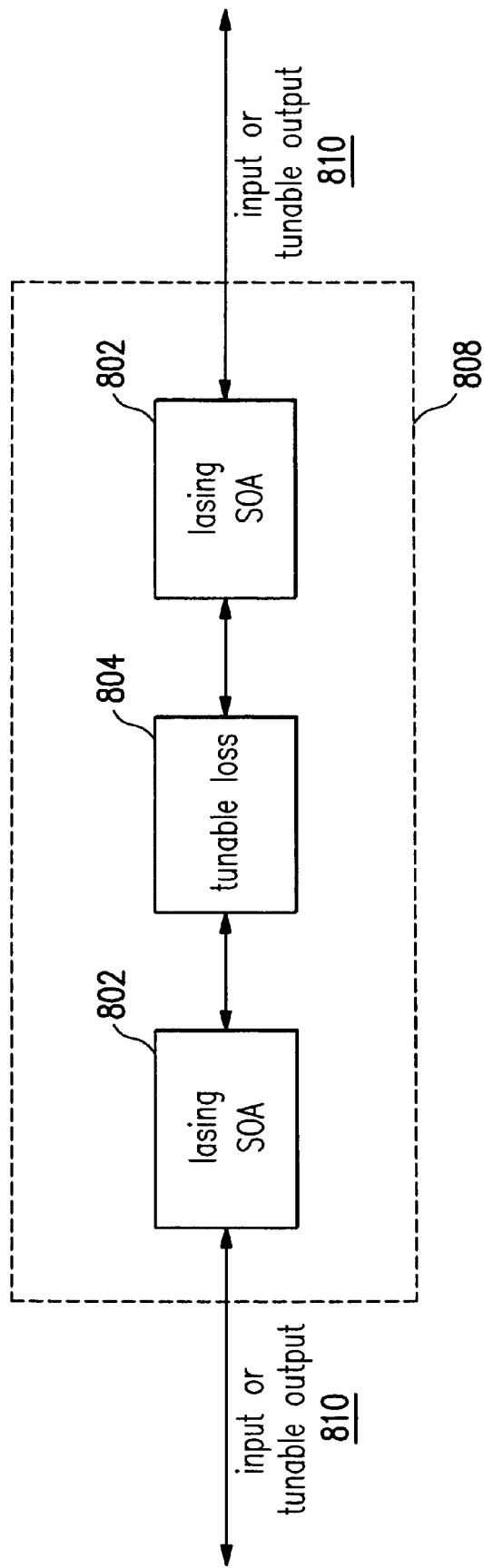
FIG. 8B is a diagram of a bidirectional apparatus 800 including two lasing SOAs 802 and a tunable loss element 804, each drawn in block form, according to a preferred embodiment of the present invention.

In applications where bidirectional signals are present, a preferred embodiment would be to put the tunable loss element 804 between two lasing SOA devices 802. Such a configuration is shown in FIG. 8B with the two lasing SOA devices 802 and the tunable loss element 804, each drawn in block form. Either end 810 of the bidirectional apparatus 808 shown in FIG. 8B may either receive an input signal or send a tunable output signal.

Figure 9:
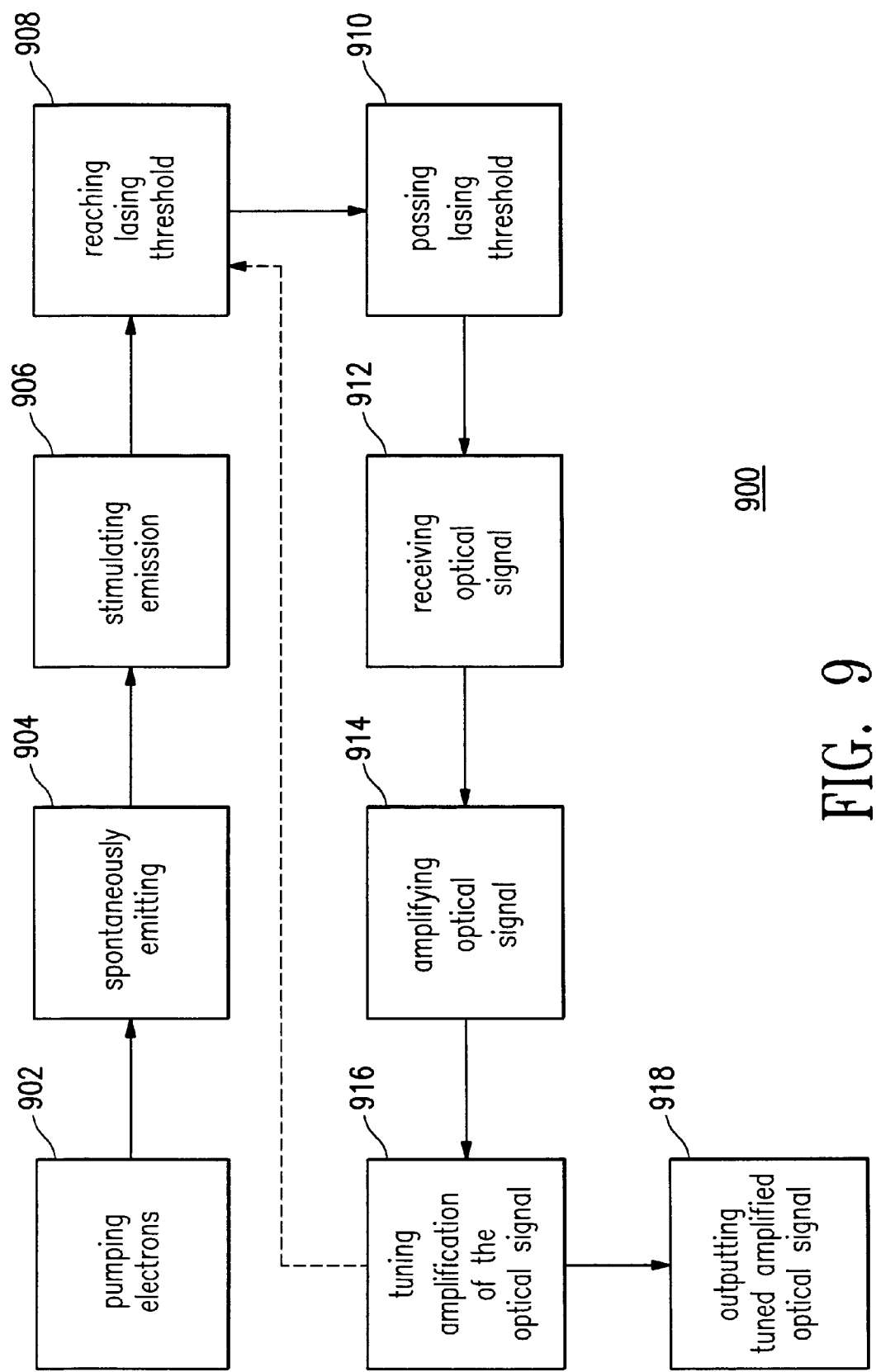
FIG. 9 is a flow chart of a method 900 for amplifying an optical signal by a tunable-gain lasing semiconductor optical amplifier according to a preferred embodiment of the present invention.

FIG. 9 is a flow chart of a method 900 for amplifying an optical signal by a tunable-gain lasing semiconductor optical amplifier according to a preferred embodiment of the present invention. The method 900 includes the steps of pumping 902 electrons, spontaneously emitting 904 photons, stimulating 906 emission of photons, reaching 908 a lasing threshold, passing 910 the lasing threshold, receiving 912 an optical signal 314, amplifying 914 the optical signal 314, tuning 916 amplification of the optical signal 314, and outputting 918 the tuned amplified optical signal 316.

The method 900 begins by the first step 902 of pumping a semiconductor gain material 304 within an optical cavity 302. The first step 902 induces the second step 904 of spontaneously emitting photons within the semiconductor gain material 304. The third step 906 involves stimulating emission of additional photons within the semiconductor gain material 304. The fourth and fifth steps 908 and 910 relate to reaching and passing a lasing threshold condition within the optical cavity 302 by further pumping. The sixth step 912 involves receiving the optical signal to be amplified 314 via a first surface of the semiconductor gain material 304. The seventh step 914 relates to amplifying the optical signal 314 as it passes through the semiconductor gain material 304. The eighth step 916 involves tuning the amplification of the optical signal 314 by adjusting a parameter of the apparatus. This eighth step 916 tunes the amplification by in effect adjusting the lasing threshold of the fourth step 908. Finally, the ninth step 918 relates to outputting the tuned amplified optical signal 316 from the apparatus.

Figure 10:
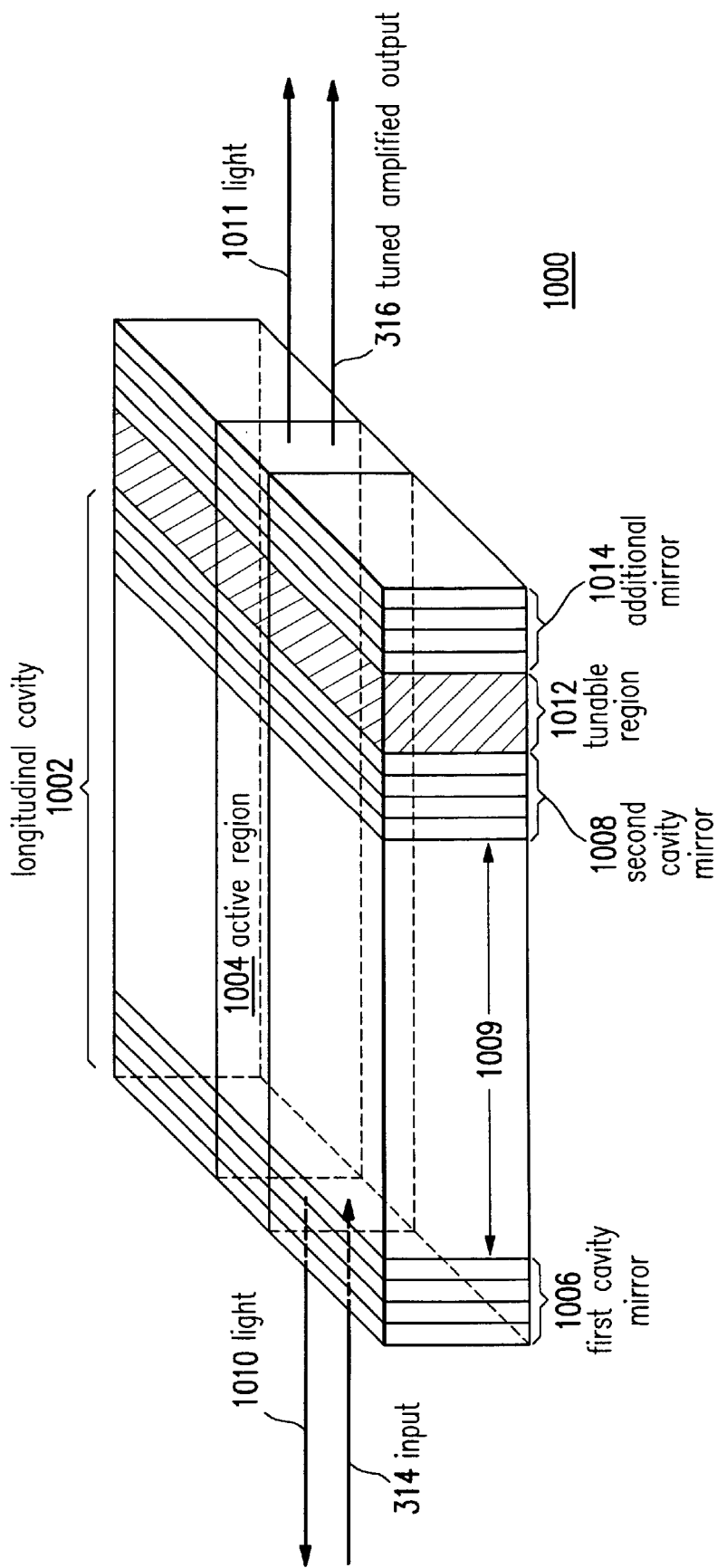
FIG. 10 is a diagram of a tunable-gain longitudinally lasing semiconductor optical amplifier (LLSOA) 1000 according to an embodiment of the present invention.

FIG. 10 is a diagram of a tunable-gain longitudinally lasing semiconductor optical amplifier (LLSOA) 1000 according to an embodiment of the present invention. The tunable-gain LLSOA 1000 includes a longitudinal optical cavity 1002 which comprises an active region 1004 sandwiched between a first cavity mirror 1006 and a second cavity mirror 1008. A tunable loss layer 1012 is sandwiched between the second cavity mirror 1008 and an additional mirror 1014. The active region 1004 is pumped such that a lasing threshold of a mode 1009 of the longitudinal cavity 1002 is reached and then surpassed. As a result, laser light 1010 and/or 1011 at the mode 1009 may be output from the longitudinal cavity 1002 via either the first mirror 1006 or the additional mirror 1014.

An optical signal 314 is input into a surface of the first mirror 1006 and proceeds to the active region 1004 where the optical signal 314 is amplified. The amplification is gain-clamped and so independent of the dynamic strength of the optical signal 314 because the laser light (1010 and/or 1011) acts as a ballast to prevent gain saturation. When the optical signal 314 is weaker, less additional photons are stimulated by the optical signal 314, but more laser light is output (1010 and/or 1011). When the optical signal 314 is stronger, more additional photons are stimulated by the optical signal 314, but less laser light is output (1010 and/or 1011).

The effective reflectivity of the second mirror 1008 is adjusted by way of the tunable region 1012 and the additional mirror 1014. By so adjusting the effective reflectivity of the second mirror 1008, the amplification applied to the optical signal 314 may be tuned. The tunable-gain LLSOA 1000 differs from the tunable-gain VLSOA in that typical mirror reflectivities are 1%. In addition, a preferred embodiment of the the tunable-gain LLSOA 1000 would use as the tunable region 1012 an electrically pumped transparent semiconductor waveguide acting as a phase-shifting layer rather than some kind of absorbing layer. In this type of phase-shifting layer, the waveguide region has a large enough bandgap so that it is transparent to the signal, and electrons and/or holes are injected into the region to cause a change in refractive index of the material. Such an embodiment could be fabricated using techniques similar to techniques for fabricating wavelength tunable distributed Bragg reflector (DBR) laser diodes, and it would avoid problems of saturation that may occur if an absorbing layer was used as the tunable region 1012.

For example, suppose the reflectivity of the second cavity mirror 1008 is about 1%, and the reflectivity of the additional mirror 1014 is about 1%. If the tunable region 1012 is such that the two mirrors 1008 and 1014 are in phase, then the effective reflectivity of the second cavity mirror 1008 would be greater than 1%. On the other hand, if the phase of the tunable region 1012 is such that the two mirror reflectivities are out of phase, then the effective reflectivity of the second cavity mirror would be less than 1%. The phase of the tunable region 1012 maybe adjusted by changing the index of refraction in the layer 1012. Hence, controlling the index of refraction in the tunable region 1012 results in adjustments to the effective reflectivity of the second cavity mirror 1008. The length and bandgap of the tunable region 1012 can be designed to give a desired phase shift for a given electrical current injected into the tunable region 1012. Using only relatively rough control of the electrical current, fine control may be achieved over the effective reflectivity of the second cavity mirror 1008 and hence over the value of the gain multiplier of the tunable-gain LLSOA 1000.

The tunable-gain LLSOA 1000 in FIG. 10 is analogous to the tunable-gain VLSOA embodiment 400 in FIG. 4A. Many other tunable-gain LLSOA embodiments 1000 are possible. For example, in analogy with FIG. 5, the additional mirror 1014 may be placed to receive the input optical signal 314, and the tunable loss .1012 may be sandwiched between the additional mirror 1014 and the first mirror 1006. Similarly, in analogy with FIGS. 6 or 7, the reflectivities of the first 1006 or the second 1008 mirrors may be adjusted by ion implantation or some other mechanism. Furthermore, in analogy with FIG. 8A, an apparatus may be made which comprises an LLSOA in series with a tunable loss element 804.

Figure 11A:
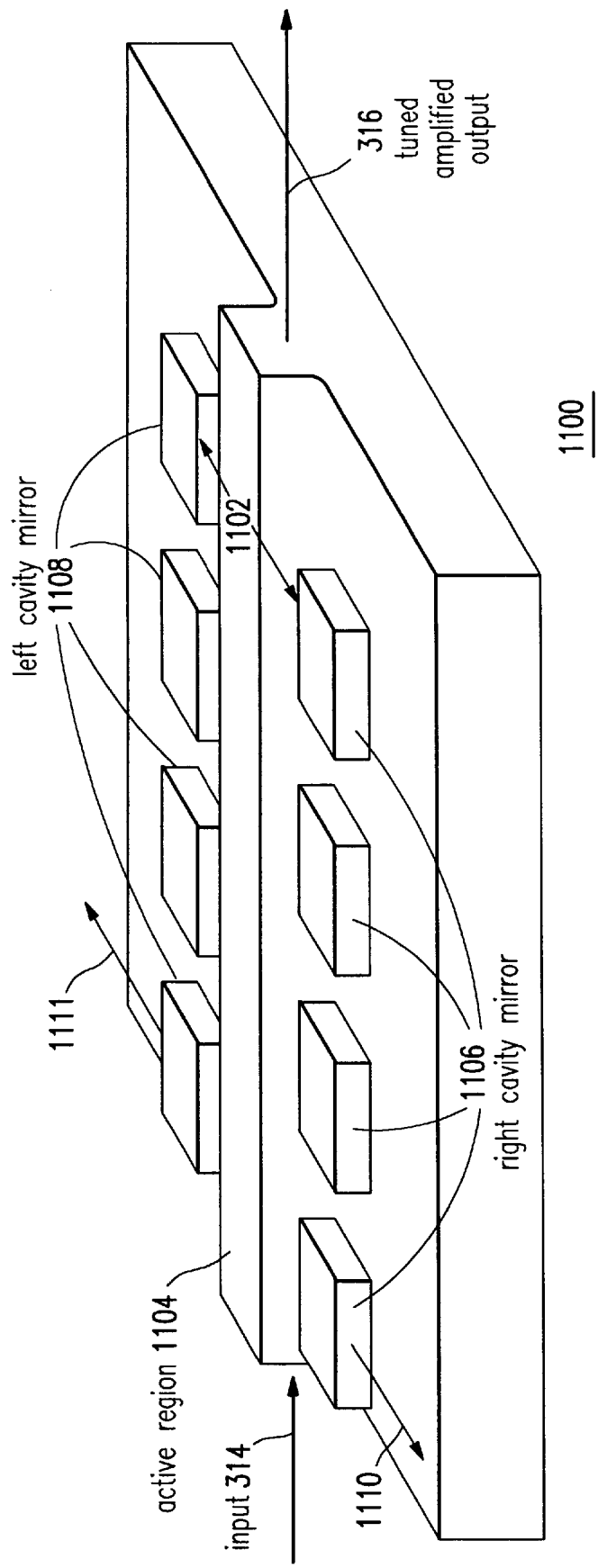
FIGS. 11A and 11B depict a tunable-gain transverse lasing semiconductor optical amplifier (TLSOA) 1100 according to an embodiment of the present invention.
Figure 11B:
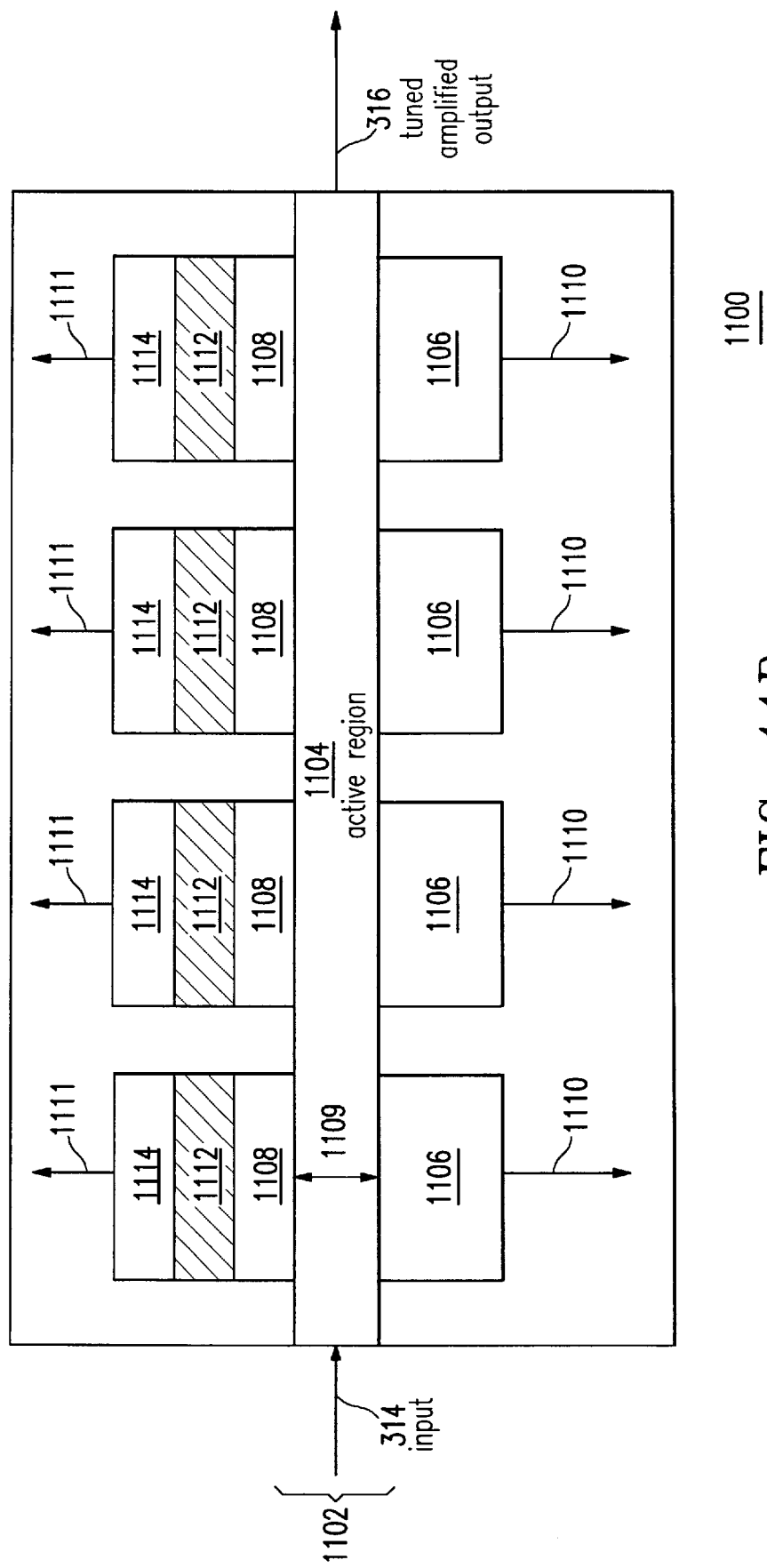

FIGS. 11A and 11B depict a tunable-gain transverse lasing semiconductor optical amplifier (TLSOA) 1100 according to an embodiment of the present invention. FIG. 11A is a perspective drawing of the tunable-gain TLSOA 1100. FIG. 11B is a top view drawing of the tunable-gain TLSOA 1100 in FIG. 11A showing a tunable region 1112 between left cavity mirrors 1008 and additional mirrors 1114.

The tunable-gain TLSOA 1100 includes a transverse optical cavity 1102 which comprises an active region 1 104 sandwiched between a right cavity mirror 1106 and a left cavity mirror 1108. A tunable region 1112 is sandwiched between the left cavity mirror 1108 and an additional mirror 1114. The active region 1104 is pumped such that a lasing threshold of a mode 1109 of the transverse cavity 1102 is reached and then surpassed. As a result, laser light 1110 and/or 1111 at the mode 1109 may be output from the transverse cavity 1102 via either the right mirror 1106 or the additional mirror 1114.

An optical signal 314 is input into a surface of the active region 1104 and proceeds to be amplified as it passes through the active region 1104. The amplification is gain-clamped and so independent of the dynamic strength of the optical signal 314 because the laser light (1110 and/or 1111) acts as a ballast to prevent gain saturation. When the optical signal 314 is weaker, less additional photons are stimulated by the optical signal 314, but more laser light is output (1110 and/or 1111). When the optical signal 314 is stronger, more additional photons are stimulated by the optical signal 314, but less laser light is output (1110 and/or 1111).

The effective reflectivity of the left mirror 1108 is adjusted by way of the tunable region 1112 and the additional mirror 1114. By so adjusting the effective reflectivity of the left mirror 1108, the amplification applied to the optical signal 314 may be tuned.

The tunable-gain TLSOA 1100 in FIGS. 11A and 11B is analogous to the tunable-gain VLSOA embodiment 400 in FIG. 4A. Many other tunable-gain TLSOA embodiments 1100 are possible. For example, in analogy with FIG. 5, the additional mirror 1114 may be placed on the right side, and the tunable region 1112 may be sandwiched between the additional mirror 1114 and the right mirror 1106. Similarly, in analogy with FIGS. 6 or 7, the reflectivities of the right 1106 or the left 1108 mirrors may be adjusted by ion implantation or some other mechanism. Furthermore, in analogy with FIG. 8A, an apparatus may be made which comprises an LLSOA in series with a tunable loss element 804.

Figure 12:
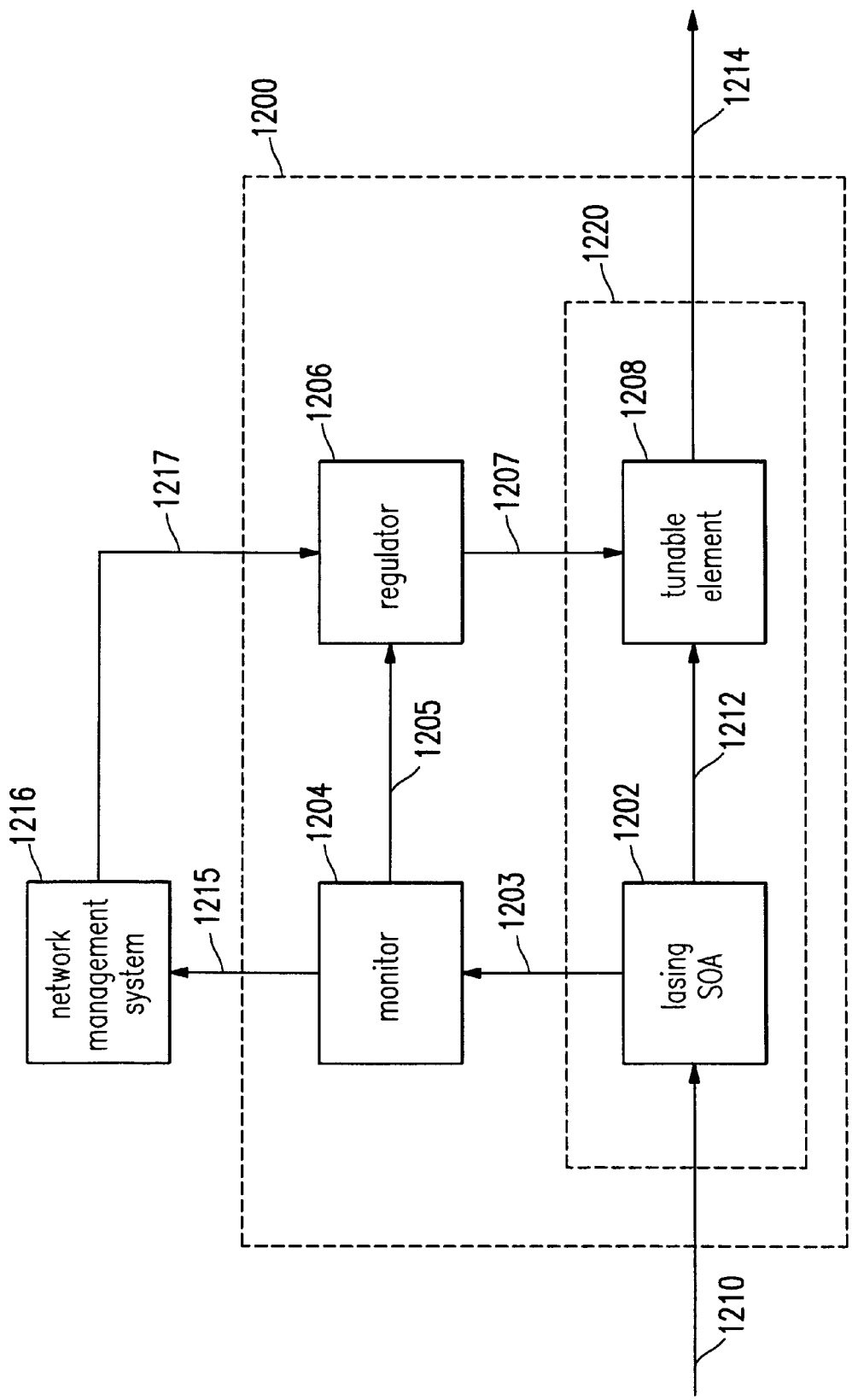
FIG. 12 depicts an optical signal power monitor and regulator 1200 in accordance with a preferred embodiment of the present invention.

FIG. 12 depicts an optical signal power monitor and regulator 1200 in accordance with a preferred embodiment of the present invention. The optical signal power monitor and regulator 1200 includes a lasing semiconductor optical amplifier (SOA) 1202, a monitor circuit 1204, a regulator circuit 1206, and a tunable element 1208. The optical signal power monitor and regulator 1200 may interact with a network management system 1216.

The lasing SOA 1202 receives an optical signal 1210. In a preferred embodiment of the present invention, the lasing SOA 1202 is a vertical lasing semiconductor optical amplifier (VLSOA). The cavity of the lasing SOA 1202 outputs a laser signal 1203 which is received by the monitor circuit 1204. The strength of the laser signal 1203 is inversely related to the strength (and hence the power) of the optical signal 1210. The lasing SOA 1202 also outputs an temporary or intermediate signal 1212 which is an amplified version of the optical signal 1210. The monitor circuit 1204 receives the laser signal 1203 and uses it to generate one or more monitoring signals 1205 and/or 1215.

For automatic regulation of the optical signal power monitor and regulator 1200, a first monitoring signal 1205 may be sent directly to the regulator circuit 1206. The regulator circuit 1206 receives the first monitoring signal 1205, uses it to generate a regulating signal 1207, and sends the regulating signal 1207 to the tunable element 1208. The tunable element 1208 is preferably a tunable gain-clamped semiconductor optical amplifier such as the ones shown in FIGS. 3A, 4, 5, 6, 7, or 8. However, the tunable element 1208 may instead by another type of device, such as a tunable fiber amplifier. The tunable element 1208 receives the regulating signal 1207 and adjusts its amplification of the temporary or intermediate signal 1212 based upon the regulating signal 1207 to generate the amplified signal 1214.

For remotely controlled monitoring and management of the optical signal power monitor and regulator 1200, a second monitoring signal 1215 may be sent to a network management system 1216. The network management system 1216 receives the second monitoring signal 1215, analyzes it along with other information to generate a control signal 1217, and sends the control signal 1217 to the regulator 1206. The regulator circuit 1206 receives the control signal 1217, uses it to generate a regulating signal 1207, and sends the regulating signal 1207 to the tunable element 1208. The tunable element 1208 receives the regulating signal 1207 and adjusts its amplification based upon the regulating signal 1207. For example, the tunable element 1208, may comprise a tunable Fabry-Perot device, a tunable optical loss element, or a tunable optical amplifier.

In an alternate embodiment, the lasing semiconductor optical amplifier 1202 and the tunable element 1208 may be combined into a single tunable-gain lasing semiconductor optical amplifier 1220. In another alternate embodiment, a wavelength filter may be placed before the lasing SOA 1202 such that the filter receives the optical signal 1210 and outputs a filtered version to the lasing SOA 1202. The filtered version may be filtered to a specific wavelength or a set of wavelengths.

Figure 13:
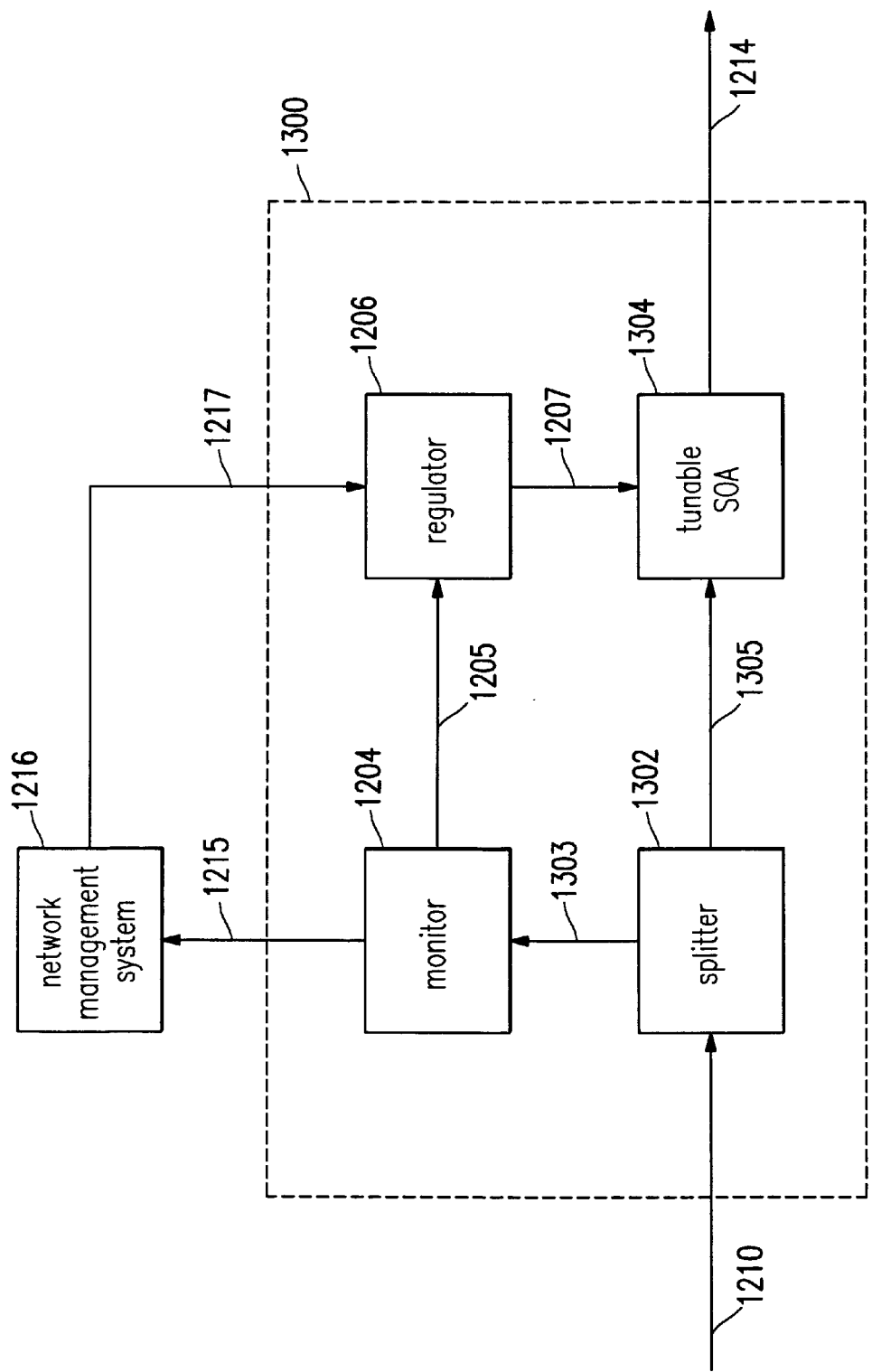
FIG. 13 depicts an optical signal power monitor and regulator 1300 in accordance with an alternate embodiment of the present invention.

FIG. 13 depicts an optical signal power monitor and regulator 1300 in accordance with an alternate embodiment of the present invention. The optical signal power monitor and regulator 1300 in FIG. 13 is similar to the optical signal power monitor and regulator 1200 in FIG. 12, except that the optical signal power monitor and regulator 1300 in FIG. 13 includes an optical beam splitter 1302 (instead of the lasing semiconductor optical amplifier 1202) and a tunable semiconductor optical amplifier 1304 (instead of the tunable element 1208).

The optical beam splitter 1302 receives the optical signal 1210 and outputs two optical signals 1303 and 1305. A first of the two optical signals 1303 is output to the lasing SOA 1202, and a second of the two optical signals 1305 is output to the tunable optical amplifier. Both signals 1303 and 1305 are versions of the optical signal 1210. For example, the first signal 1303 may have 10% of the power of the optical signal 1210 for monitoring purposes, and the second signal 1305 may retain 90% of the power of the optical signal 1210. Of course, the relative split of the power of the optical signal 1210 may be suitably adjusted. For example, the first signal 1303 may have 5% of the power of the optical signal 1210 for monitoring purposes, and the second signal 1305 may retain 95% of the power of the optical signal. 1210. In addition, the splitter 1302 may be either an active splitter or a passive splitter. Furthermore, the splitter 1302 may comprise a wavelength filter for a specific wavelength or a set of wavelengths.

The monitor 1204 receives the first optical signal 1303, and the tunable semiconductor optical amplifier 1304 operates on the second optical signal 1305.

Figure 14:
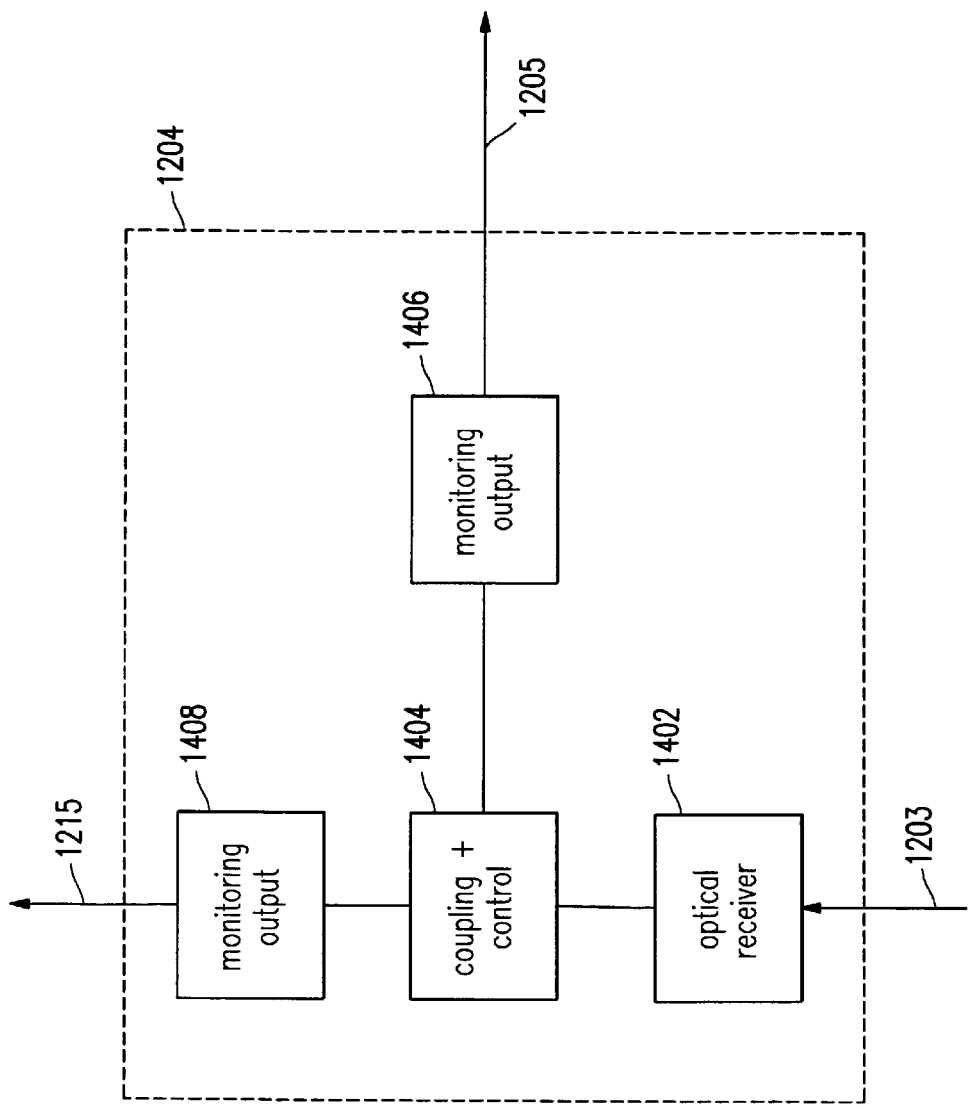
FIG. 14 depicts a monitor circuit 1204 in accordance with an embodiment of the present invention.

FIG. 14 depicts a monitor circuit 1204 in accordance with an embodiment of the present invention. The monitor circuit 1204 comprises an optical receiver 1402, coupling and control circuitry 1404, and one or more monitoring output circuits 1406 and/or 1408. The optical receiver 1402 receives the laser signal 1203 from the vertical lasing SOA 1202. The coupling and control circuitry 1404 connects the optical receiver 1402 to the monitoring output circuit(s) 1406 and/or 1408. The monitoring output circuits 1406 and/or 1408 output the monitoring signal 1205 and/or 1215 to the regulator 1206 and/or the network management system 1216.

Figure 15:
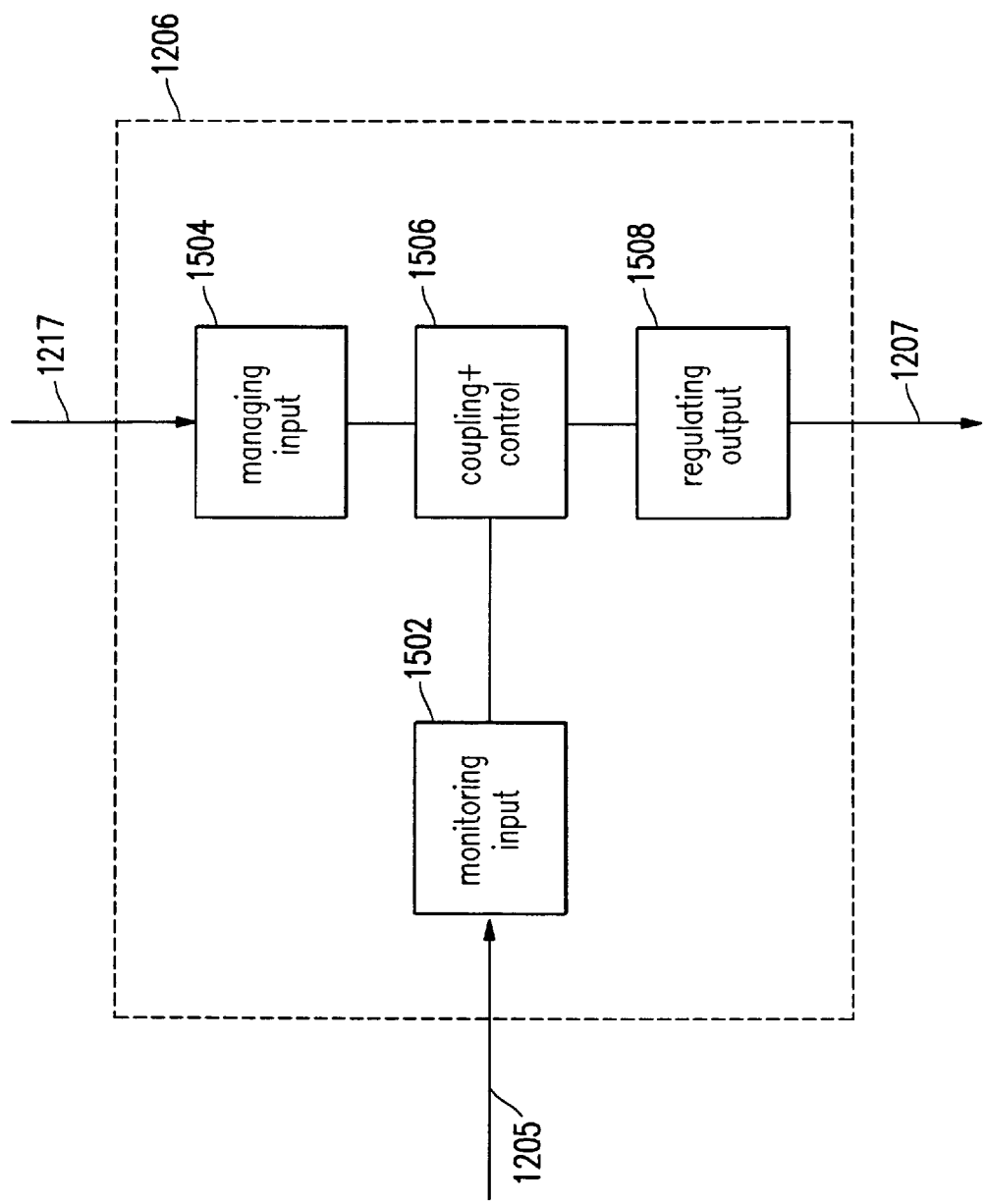
FIG. 15 depicts a regulator circuit 1206 in accordance with an embodiment of the present invention.

FIG. 15 depicts a regulator circuit 1206 in accordance with an embodiment of the present invention. The regulator circuit 1206 one or more input circuits 1502 and/or 1504, coupling and control circuitry 1506, and a regulating output circuit 1508. One input circuit 1502 may be a monitoring input circuit 1502 which receives the monitoring signal 1205 from the monitor circuit 1204. The other input circuit 1504 may be a managing input circuit 1504 which receives the managing signal 1217 from the network management system 1216. The coupling and control circuitry connects the input circuit(s) 1502 and/or 1504 to the regulating output circuit 1508. The regulating output circuit 1508 output the regulating signal 1207 to the tunable element 1208. For example, if the tunable element 1208 adjusted the transmissivity of a liquid crystal layer to achieve tuning, then the regulating signal 1207 would comprise a voltage signal to control the transmissivity of the liquid crystal layer.

Figure 16:
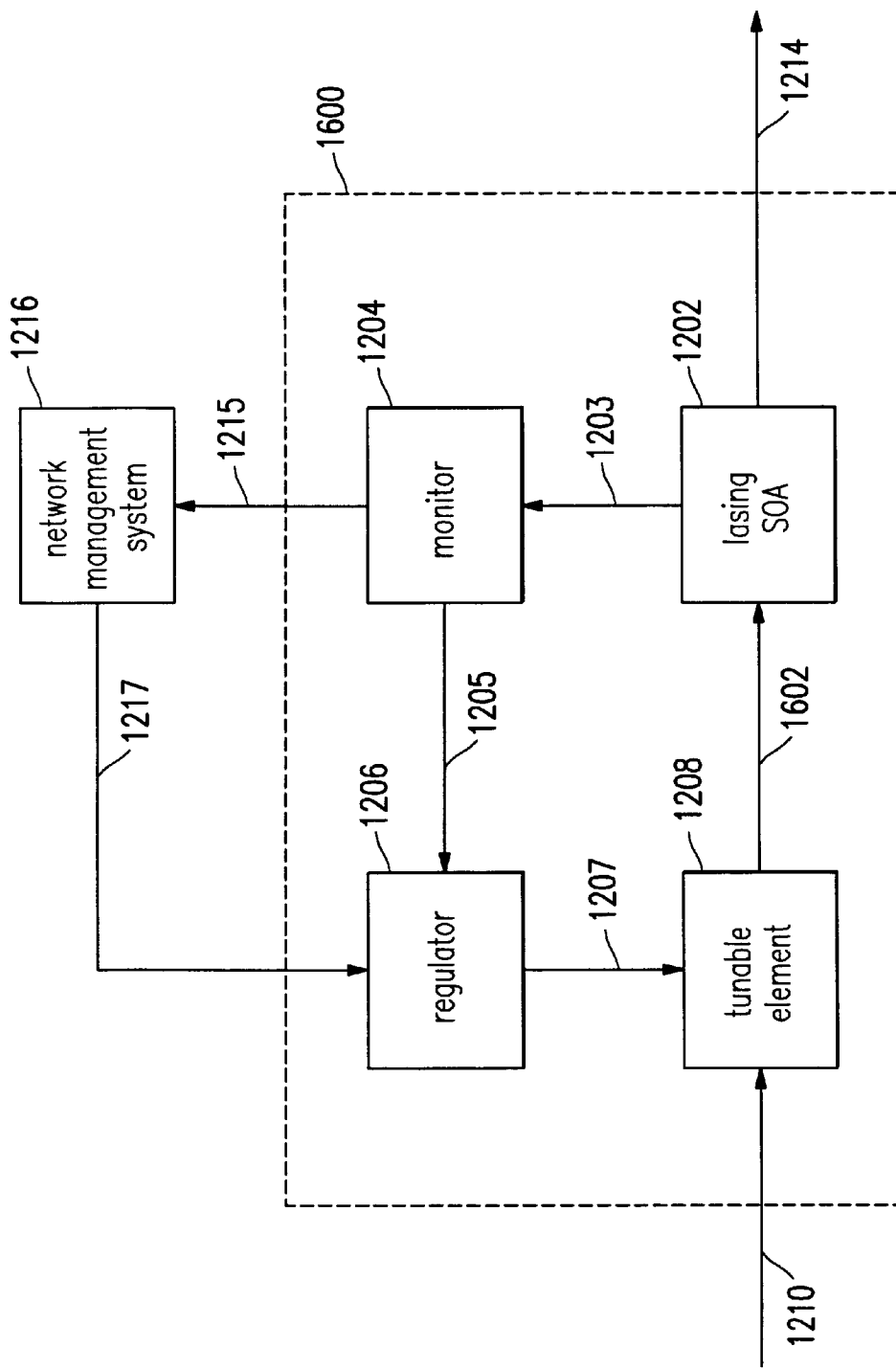
FIG. 16 depicts an optical signal power monitor and regulator 1600 in accordance with an alternate embodiment of the present invention.

FIG. 16 depicts an optical signal power monitor and regulator 1600 in accordance with an alternate embodiment of the present invention. The system in FIG. 16 is similar to the apparatus in FIG. 12. However, the system in FIG. 16 comprises a feed-back configuration, while the system in FIG. 12 comprises a feed-forward configuration. The system in FIG. 12 is feed-forward because the monitoring and regulating is used to tune the amplification at a tunable element 1208 which is forward in the optical path from the lasing SOA 1202. In contrast, the system in FIG. 16 is feed-back because the monitoring and regulating is used to tune the amplification at a tunable element 1208 which is backwards in the optical path from the lasing SOA 1202.

In FIG. 16, the tunable element 1202 receives the optical signal 1210. The tunable element 1202 has a tunable output 1602 which is transmitted to the lasing SOA 1202. The lasing SOA 1202 outputs the amplified signal 1214. The lasing SOA 1202 also outputs the laser signal 1203 to the monitor 1204. As in the discussion above relating to FIG. 12, the laser signal 1203 is used to monitor and regulate the amplified signal 1214.

Figure 17:
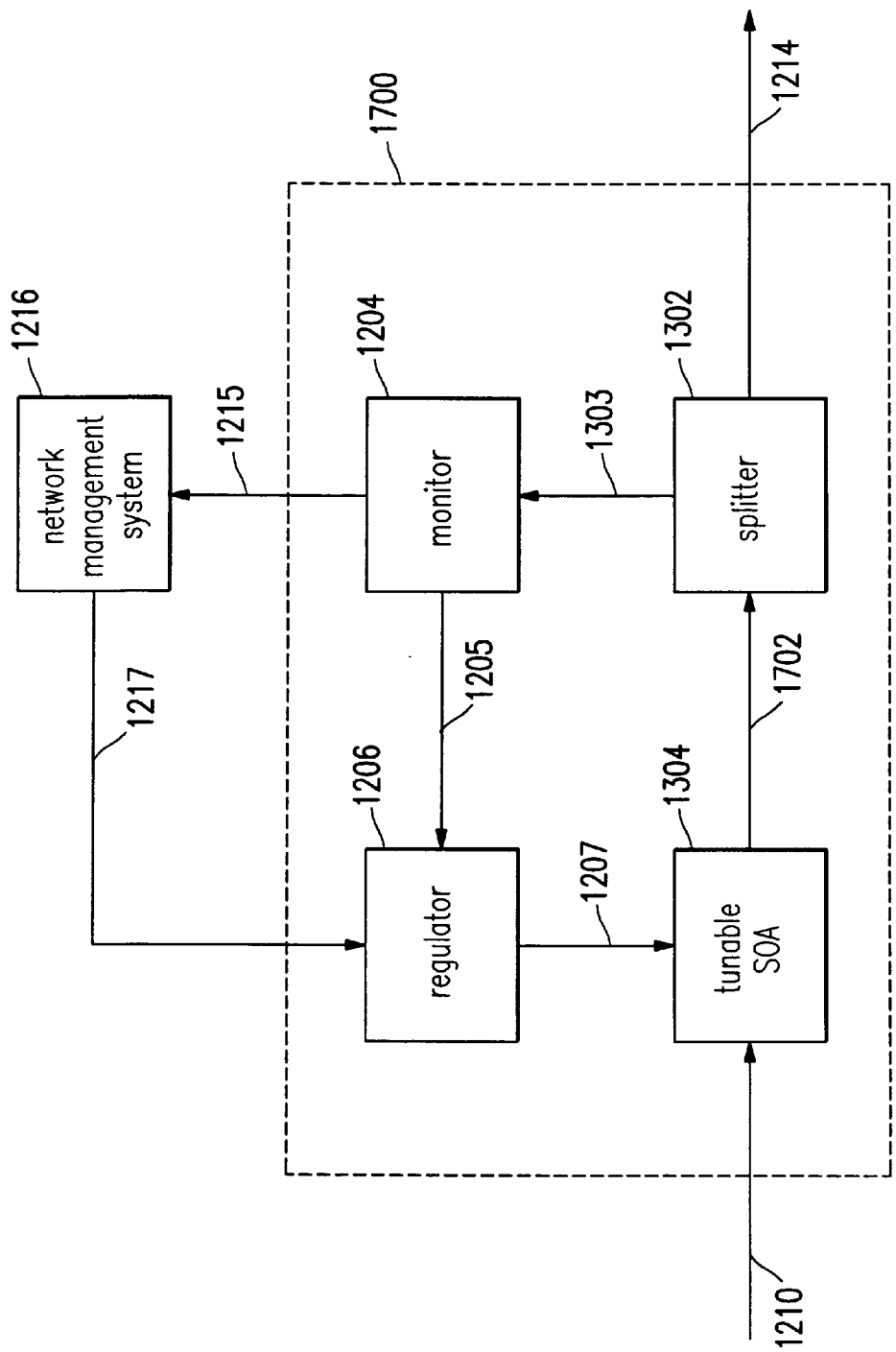
FIG. 17 depicts an optical signal power monitor and regulator 1700 in accordance with an alternate embodiment of the present invention.

FIG. 17 depicts an optical signal power monitor and regulator 1700 in accordance with an alternate embodiment of the present invention. The system in FIG. 17 is similar to the apparatus in FIG. 13. However, the system in FIG. 17 comprises a feed-back configuration, while the system in FIG. 13 comprises a feed-forward configuration. The system in FIG. 13 is feed-forward because the monitoring and regulating is used to tune the amplification at a tunable SOA 1304 which is forward in the optical path from the splitter 1302. In contrast, the system in FIG. 17 is feed-back because the monitoring and regulating is used to tune the amplification at a tunable SOA 1304 which is backwards in the optical path from the splitter 1302.

In FIG. 17, the tunable SOA 1304 receives the optical signal 1210. The tunable SOA 1304 has a tunable amplified output 1702 which is transmitted to the splitter 1302. The splitter 1302 outputs the amplified signal 1214. The splitter 1302 also outputs a split signal 1303 to the monitor 1204. As in the discussion above relating to FIG. 13, the split signal 1303 is used to monitor and regulate the amplified signal 1214.

The above description is included to illustrate the operation of the preferred embodiments and is not meant to limit the scope of the invention. The scope of the invention is to be limited only by the following claims. From the above description, many variations will be apparent to one skilled in the art that would yet be encompassed by the spirit and scope of the invention.

What is claimed is:

1. An optical signal power control apparatus for controlling power of an optical signal, the apparatus comprising:
   a tunable gain lasing semiconductor optical amplifier ("SOA") for amplifying an optical signal traveling through the lasing SOA, the tunable gain lasing SOA comprising:
      an input that receives the optical signal;
      an output that transmits the amplified optical signal;
      a semiconductor gain medium coupled between the input and the output for amplifying the optical signal traveling through the semiconductor gain medium, wherein a gain of the semiconductor gain medium is tunable; and
      a cavity including the semiconductor gain medium, for generating a laser signal which acts as a ballast with respect to amplification of the optical signal;
   a first optical splitting device, coupled to receive the optical signal, for separating a first portion of the optical signal from the optical signal;
   a first monitor, coupled to receive the first portion of the optical signal from the first optical splitting device, for converting the first portion of the optical signal to a first electrical monitoring signal; and
   a first regulator, coupled to receive the first electrical monitoring signal from the first monitor, for controlling a gain across the tunable gain lasing SOA in response to the first electrical monitoring signal.

2. The optical signal power control apparatus of claim 1 wherein the tunable gain lasing SOA and the first regulator are integrated on a same chip.

3. The optical signal power control apparatus of claim 1 wherein the tunable gain lasing SOA comprises a tunable gain vertical lasing SOA.

4. The optical signal power control apparatus of claim 1 wherein the tunable gain lasing SOA comprises a tunable gain longitudinal lasing SOA.

5. The optical signal power control apparatus of claim 1 wherein the tunable gain lasing SOA comprises a tunable gain transverse lasing SOA.

6. The optical signal power control apparatus of claim 1 wherein the first optical splitting device is positioned in front of the tunable gain lasing SOA with respect to a direction of propagation of the optical signal.

7. The optical signal power control apparatus of claim 1 wherein the first optical splitting device is positioned behind the tunable gain lasing SOA with respect to a direction of propagation of the optical signal.

8. The optical signal power control apparatus of claim 1 wherein the first optical splitting device comprises an element selected from a group consisting of a directional coupler, a tap coupler and a multi-mode interferometer type coupler.

9. The optical signal power control apparatus of claim 1 wherein the first monitor comprises an element selected from a group consisting of a PIN diode and an avalanche photodiode.

10. The optical signal power control apparatus of claim 1 wherein the first regulator comprises a comparator that determines whether a level on the first electrical monitoring signal crosses a threshold value.

11. The optical signal power control apparatus of claim 10 wherein the first regulator causes an increase in the output power of tunable gain lasing SOA in response to the level on the first electrical monitoring signal crossing the threshold value.

12. The optical signal power control apparatus of claim 1 wherein the cavity of the tunable gain lasing SOA further comprises:
a tunable element that adjusts a gain associated with the cavity.

13. The optical signal power control apparatus of claim 12 wherein the first optical splitting device is coupled directly to the input of the tunable gain lasing SOA.

14. The optical signal power control apparatus of claim 12 wherein the output of the tunable gain lasing SOA is coupled directly to the first optical splitting device.

15. The optical signal power control apparatus of claim 12 wherein the first regulator controls the gain across the tunable gain lasing SOA by adjusting the tunable element.

16. The optical signal power control apparatus of claim 12 wherein the tunable element comprises liquid crystal having an adjustable transmissivity.

17. The optical signal power control apparatus of claim 1 further comprising:
a second optical splitting device, the tunable gain lasing SOA coupled between the first optical splitting device and the second optical splitting device, for separating a second portion of the optical signal from the optical signal;
a second monitor, coupled to receive the second portion of the optical signal from the second optical splitting device, for converting the second portion of the optical signal to a second electrical monitoring signal; and
a second regulator, coupled to receive the second electrical monitoring signal from the second monitor, for controlling the gain across the tunable gain lasing SOA in response to the second electrical monitoring signal.

18. The optical signal power control apparatus of claim 2 wherein the tunable gain lasing SOA and the first regulator and the second regulator are integrated on the same chip.

19. The optical signal power control apparatus of claim 2 wherein the first regulator and the second regulator are the same regulator.

20. The optical signal power control apparatus of claim 4 wherein the regulator controls the gain of the tunable gain lasing SOA in response to a ratio of the first and second electrical monitoring signals.

21. An optical signal power control apparatus for controlling power of an optical signal, the apparatus comprising:
a lasing SOA for amplifying an optical signal traveling through the lasing SOA, the lasing SOA comprising:
an input that receives the optical signal;
an output that transmits the amplified optical signal;
a semiconductor gain medium coupled between the input and the output for amplifying the optical signal traveling through the semiconductor gain medium; and
a cavity including the semiconductor gain medium, for generating a laser signal which acts as a ballast with respect to amplification of the optical signal;
an optical splitting device, coupled to receive the optical signal, for separating a portion of the optical signal from the optical signal;
a monitor, coupled to receive the portion of the optical signal from the optical splitting device, for converting the portion of the optical signal to an electrical monitoring signal;
a regulator, coupled to receive the electrical monitoring signal from the monitor, for generating an electrical regulating signal in response to the electrical monitoring signal; and
a tunable element, coupled to receive the optical signal and the electrical regulating signal, for adjusting a power level of the optical signal in response to the electrical regulating signal.

22. The optical signal power control apparatus of claim 6 wherein the lasing SOA and the tunable element are integrated on a same chip.

23. The optical signal power control apparatus of claim 6 wherein the lasing SOA is a vertical lasing SOA.

24. The optical signal power control apparatus of claim 6 wherein the lasing SOA is a longitudinal lasing SOA.

25. The optical signal power control apparatus of claim 6 wherein the lasing SOA is a transverse lasing SOA.

26. The optical signal power control apparatus of claim 6 wherein the optical splitting device is positioned in front of the tunable element with respect to a direction of propagation of the optical signal.

27. The optical signal power control apparatus of claim 6 wherein the optical splitting device is positioned behind the tunable element with respect to a direction of propagation of the optical signal.

28. The optical signal power control apparatus of claim 6 wherein the tunable element comprises liquid crystal having an adjustable transmissivity.

29. The optical signal power control apparatus of claim 6 wherein the tunable element comprises an optical attenuator.

30. The optical signal power control apparatus of claim 6 wherein the tunable element comprises a tunable gain lasing SOA.

31. An optical signal power control apparatus for controlling power of an optical signal, the apparatus comprising:
a first lasing SOA for amplifying an optical signal traveling through the first lasing SOA;
a second lasing SOA, coupled to receive the optical signal amplified within the first lasing SOA, for further amplifying the optical signal;
an optical splitting device, coupled to receive the optical signal, for separating a portion of the optical signal from the optical signal;
a monitor, coupled to receive the portion of the optical signal from the optical splitting device, for converting the portion of the optical signal to an electrical monitoring signal;
a regulator, coupled to receive the electrical monitoring signal from the monitor, for generating an electrical regulating signal in response to the electrical monitoring signal; and
a tunable element, coupled to receive the optical signal and the electrical regulating signal, for adjusting a power level of the optical signal in response to the electrical regulating signal.

32. The optical signal power control apparatus of claim 21 wherein the tunable element is positioned between the first lasing SOA and the second lasing SOA.

33. The optical signal power control apparatus of claim 21 wherein at least one of the lasing SOAs is a vertical lasing SOA.

34. The optical signal power control apparatus of claim 21 wherein at least one of the lasing SOAs is a longitudinal lasing SOA.

35. The optical signal power control apparatus of claim 21 wherein at least one of the lasing SOAs is a transverse lasing SOA.

36. A method for controlling power of an optical signal using a lasing SOA, the method comprising:
    amplifying an optical signal using a lasing SOA;
    splitting a portion of the optical signal from the optical signal;
    converting the portion of the optical signal into an electrical monitoring signal;
    generating an electrical regulating signal in response to the electrical monitoring signal; and
    adjusting a power level of the optical signal in response to the electrical regulating signal.

37. The method of claim 21 wherein splitting a portion of the optical signal from the optical signal comprises:
    splitting the portion of the optical signal from the optical signal before the optical signal enters the lasing SOA.

38. The method, of claim 21 wherein splitting a portion of the optical signal from the optical signal comprises:
    splitting the portion of the optical signal from the optical signal after the optical signal exits the lasing SOA.

39. The method of claim 21 wherein adjusting a power level of the optical signal comprises:
    adjusting a gain of the lasing SOA in response to the electrical regulating signal.

40. The method of claim 21 further comprising:
    attenuating the optical signal, wherein adjusting a power level of the optical signal comprises adjusting an amount of the attenuation.

41. The method of claim 21 wherein the electrical monitoring signal relates to a power level of the optical signal.

42. The method of claim 21 wherein the electrical regulating signal identifies a power level of the electrical monitoring signal crossing a threshold value.

* * * * *